US009768253B2

(12) United States Patent
Hoki

(10) Patent No.: US 9,768,253 B2
(45) Date of Patent: Sep. 19, 2017

(54) SEMICONDUCTOR DEVICE INCLUDING CRYSTAL DEFECT REGION AND METHOD FOR MANUFACTURING THE SAME

(71) Applicant: ROHM CO., LTD., Kyoto (JP)

(72) Inventor: Tomonori Hoki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/266,911

(22) Filed: Sep. 15, 2016

(65) Prior Publication Data

US 2017/0084693 A1   Mar. 23, 2017

(30) Foreign Application Priority Data

Sep. 17, 2015   (JP) .................................. 2015-184106

(51) Int. Cl.

| | |
|---|---|
| *H01L 29/32* | (2006.01) |
| *H01L 29/78* | (2006.01) |
| *H01L 29/66* | (2006.01) |
| *H01L 29/06* | (2006.01) |
| *H01L 29/08* | (2006.01) |
| *H01L 29/10* | (2006.01) |
| *H01L 29/739* | (2006.01) |

(Continued)

(52) U.S. Cl.
CPC ........ *H01L 29/0684* (2013.01); *H01L 21/263* (2013.01); *H01L 21/308* (2013.01); *H01L 29/0619* (2013.01); *H01L 29/0634* (2013.01); *H01L 29/0865* (2013.01); *H01L 29/1004* (2013.01); *H01L 29/32* (2013.01); *H01L 29/66333* (2013.01); *H01L 29/66712* (2013.01); *H01L 29/7395* (2013.01); *H01L 29/7811* (2013.01); *H01L 21/268* (2013.01); *H01L 21/324* (2013.01)

(58) Field of Classification Search
CPC . H01L 29/32; H01L 29/7811; H01L 29/7395; H01L 29/66712
See application file for complete search history.

(56) References Cited

U.S. PATENT DOCUMENTS

| | | | | |
|---|---|---|---|---|
| 5,243,205 A | * | 9/1993 | Kitagawa | .............. H01L 21/263 |
| | | | | 257/107 |
| 5,808,352 A | * | 9/1998 | Sakamoto | ............... H01L 21/26 |
| | | | | 257/156 |

(Continued)

FOREIGN PATENT DOCUMENTS

JP   2012-142330 A   7/2012

*Primary Examiner* — Evan Pert
(74) *Attorney, Agent, or Firm* — Rabin & Berdo, P.C.

(57) ABSTRACT

A semiconductor device includes: an n type semiconductor layer including an active region and an inactive region; an element structure formed in the active region and including at least an active side p type layer to form pn junction with n type portion of the n type semiconductor layer; an inactive side p type layer formed in the inactive region and forming pn junction with the n type portion of the n type semiconductor layer; a first electrode electrically connected to the active side p type layer in a front surface of the n type semiconductor layer; a second electrode electrically connected to the n type portion of the n type semiconductor layer in a rear surface of the n type semiconductor layer; and a crystal defect region formed in both the active region and the inactive region and having different depths in the active region and the inactive region.

17 Claims, 21 Drawing Sheets

(51) Int. Cl.
    *H01L 21/263*     (2006.01)
    *H01L 21/308*     (2006.01)
    *H01L 21/324*     (2006.01)
    *H01L 21/268*     (2006.01)

(56) References Cited

U.S. PATENT DOCUMENTS

| | | | |
|---|---|---|---|
| 8,017,974 B2* | 9/2011 | Hisamoto | H01L 29/0619 |
| | | | 257/139 |
| 9,048,250 B2* | 6/2015 | Yamada | H01L 29/66477 |
| 2005/0280076 A1* | 12/2005 | Barthelmess | H01L 21/263 |
| | | | 257/327 |
| 2008/0246096 A1* | 10/2008 | Sakakibara | H01L 29/0634 |
| | | | 257/401 |
| 2009/0184338 A1* | 7/2009 | Hisamoto | H01L 29/0619 |
| | | | 257/139 |
| 2009/0289278 A1* | 11/2009 | Torii | H01L 29/0834 |
| | | | 257/139 |
| 2010/0019330 A1* | 1/2010 | Cannon | H01L 29/0653 |
| | | | 257/402 |
| 2010/0187598 A1* | 7/2010 | Endo | H01L 29/7394 |
| | | | 257/329 |
| 2011/0175139 A1* | 7/2011 | Torii | H01L 29/0619 |
| | | | 257/139 |
| 2016/0181104 A1* | 6/2016 | Schmidt | H01L 21/221 |
| | | | 257/139 |
| 2017/0012109 A1* | 1/2017 | Akagi | H01L 29/66068 |

* cited by examiner

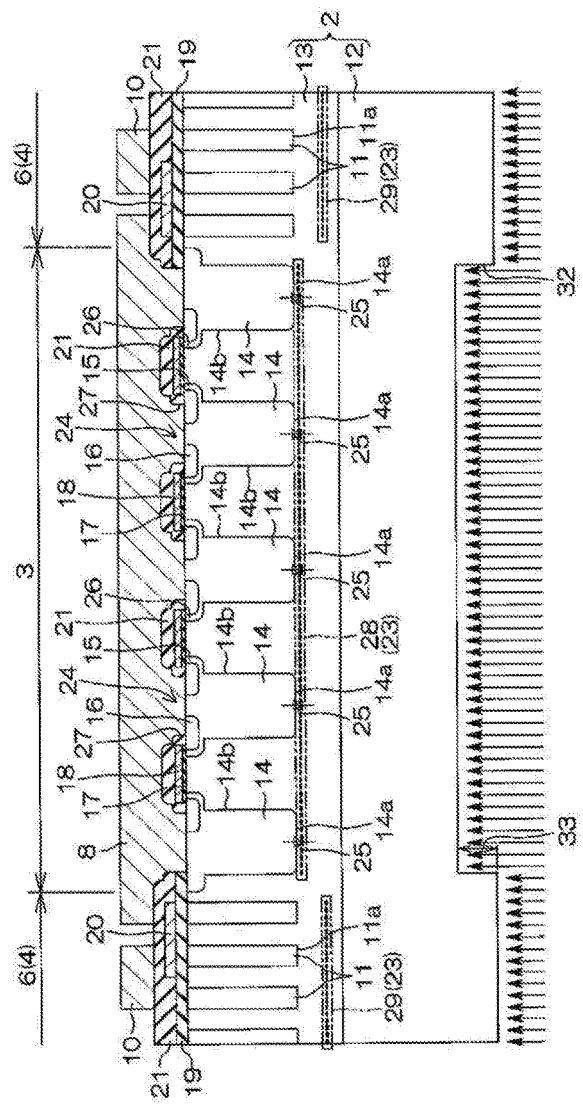

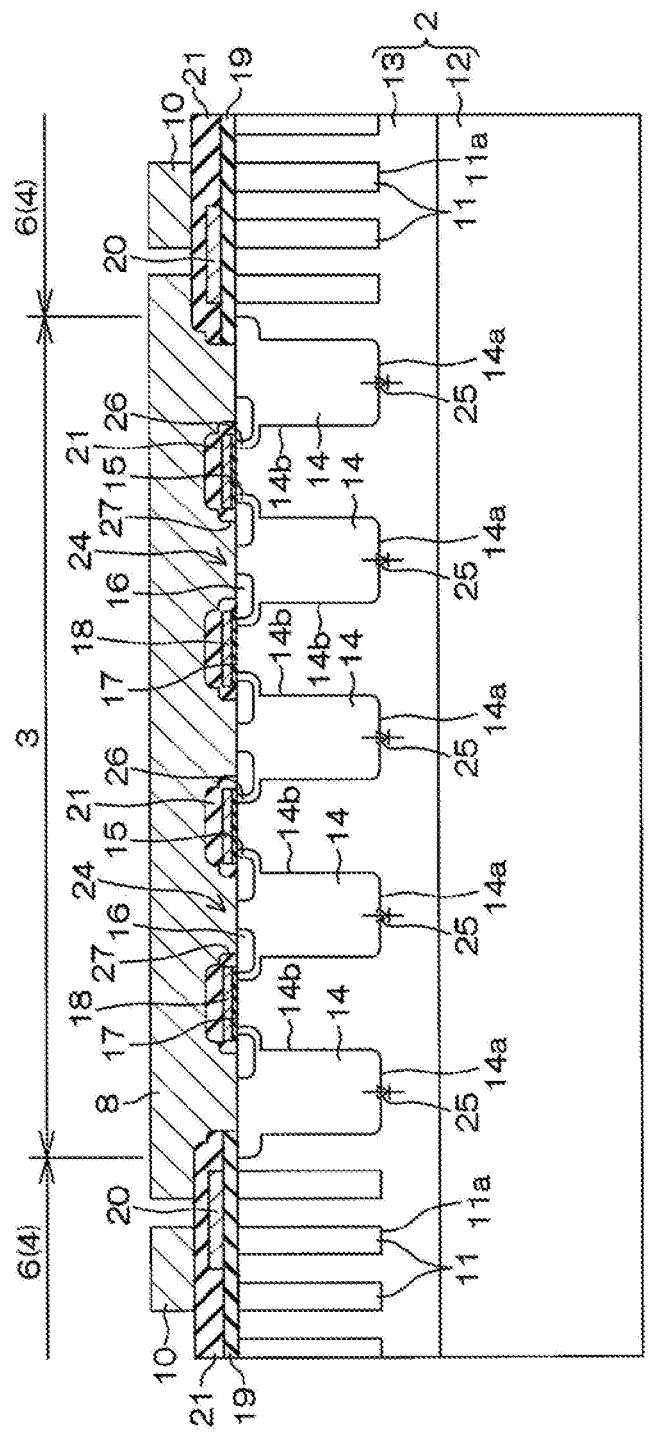

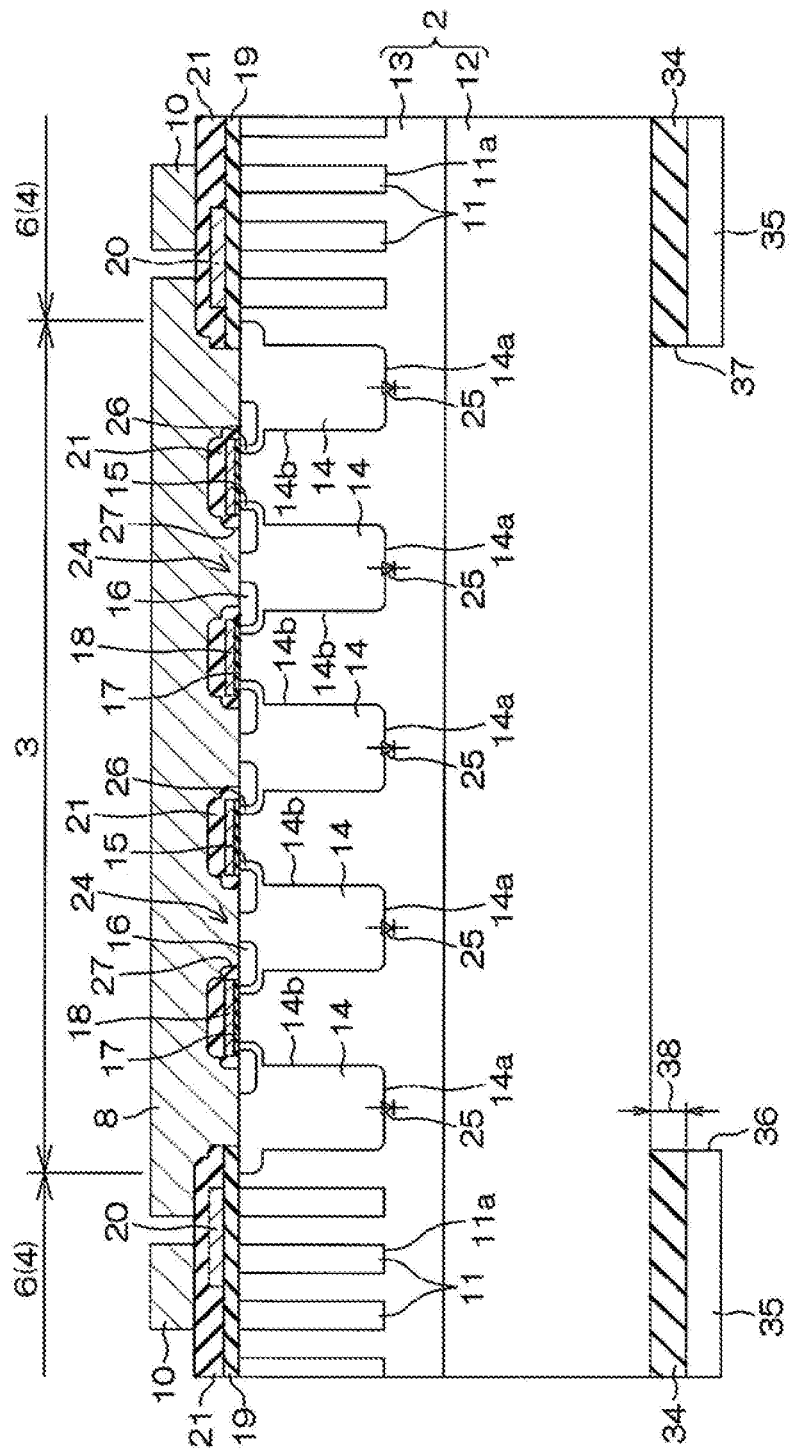

SEMICONDUCTOR DEVICE INCLUDING CRYSTAL DEFECT REGION AND METHOD FOR MANUFACTURING THE SAME

CROSS-REFERENCE TO RELATED APPLICATION

This application is based upon and claims the benefit of priority from Japanese Patent Application No. 2015-184106, filed on Sep. 17, 2015, the entire contents of which are incorporated herein by reference.

TECHNICAL FIELD

The present disclosure relates to a vertical semiconductor device and a method for manufacturing the same.

BACKGROUND

A vertical semiconductor device, in which accelerated ions such as proton, helium or the like are irradiated initially to a rear surface of a silicon substrate, is known. This achieves a reduction of a reverse recovery time trr of a parasitic diode of the semiconductor device by controlling a carrier lifetime at the turn-off time of the parasitic diode. For example, in the related art, there has been proposed an n channel type MISFET having a super junction structure including an $n^+$ type drain layer, an n type base layer, a p type column layer, a p type base layer, an $n^+$ type source layer, a gate insulating film, a gate electrode, a source electrode, a drain electrode, a depletion layer relaxation area and a trap level area. In this n channel type MISFET, an interface among the n type base layer and the p type base layer and the p type column layer is a pn junction and forms a parasitic diode (body diode).

SUMMARY

However, studies made by the present inventor have revealed that the way to irradiate the accelerated ions such as proton, helium or the like over the entire rear surface of the silicon substrate may lower the breakdown voltage of the semiconductor device, while controlling the carrier lifetime. The present disclosure provides some embodiments of a semiconductor device which is capable of selectively designating a desired region and preventing a reduction of a breakdown voltage while controlling a carrier lifetime at the turn-off time of a pn junction in the designated region, and a method for manufacturing the same.

According to one embodiment of the present disclosure, there is provided a semiconductor device including: an n type semiconductor layer including an active region and an inactive region; an element structure which is formed in the active region and includes at least an active side p type layer to form a pn junction with an n type portion of the n type semiconductor layer; an inactive side p type layer which is formed in the inactive region and forms a pn junction with the n type portion of the n type semiconductor layer; a first electrode which is electrically connected to the active side p type layer in a front surface of the n type semiconductor layer; a second electrode which is electrically connected to the n type portion of the n type semiconductor layer in a rear surface of the n type semiconductor layer; and a crystal defect region is formed in both of the active region and the inactive region and the crystal defect region in the active region is formed at a depth within the n type semiconductor layer different that of the crystal defect region in the inactive region.

In a case where the element structure is a vertical MISFET or a vertical IGBT, the pn junction may be, for example, a parasitic diode formed by a pn junction between the p type base layer or the like and the n drain layer of the element. In a case where the element structure is a pn diode, the pn junction may be the pn diode itself. This kind of pn junction is in a turn-on state when a forward voltage is applied, and is in a turn-off state when a reverse voltage is applied. When the pn junction is turned off, there occurs a reverse recovery effect where carriers (holes) injected into the n type portion of the n type semiconductor layer are moved to the first electrode, and carriers (electrons) injected into the active side p type layer are moved to the second electrode. A current flown due to this effect is a reverse recovery current. Due to the movement of carriers, a depletion layer is spread from the pn junction and the parasitic diode enters a turn-off state.

According to this embodiment, the crystal defect region is disposed in the active region. The crystal defect region includes donorized charged particles. On the other hand, the crystal defect region in the inactive region is formed at a depth different from that of the active region. Therefore, when the crystal defect region is formed to be close to the active side pn junction while being distant from the inactive side pn junction, it is possible to prevent a reduction of the breakdown voltage while controlling the carrier lifetime at the turn-off time of the pn junction. Specifically, in the active region, since a trap level (recombination center) formed by the crystal defect region is close to the pn junction, it is possible to make pair-annihilation of holes and electrons in a short time, thereby shortening the reverse recovery time. On the other hand, in the inactive region, since an effect of the crystal defect region can be reduced, it is possible to prevent a reduction of the breakdown voltage by the crystal defect region. In other words, in this embodiment, it is possible to selectively designate a desired region (here, the active region) and prevent a reduction of the breakdown voltage while controlling the carrier lifetime at the turn-off time of the pn junction in the designated region.

In one embodiment, the crystal defect region in the active region may be formed in the vicinity of the bottom of the active side p type layer (in the vicinity of the active side pn junction), and the crystal defect region in the inactive region may be formed to be separated from the bottom of the inactive side p type layer such that the crystal defect region is closer to the rear surface of the n type semiconductor layer than to the bottom of the inactive side p type layer (in other words, the crystal defect region in the inactive region is positioned further away from the inactive side pn junction and closer to the rear surface of the n type semiconductor layer).

In one embodiment, the distance to the crystal defect region in the active region from the active side p type layer may be 5 μm or less, and the distance to the crystal defect region in the inactive region from the bottom of the inactive side p type layer may be 5 μm or more. In one embodiment, the active side p type layer and the inactive side p type layer may have the same depth.

In one embodiment, the element structure may include: an n type base layer; a p type base layer which is partially formed on a surficial layer portion of the n type base layer in the active region; an n type source layer which is partially formed on the surficial layer portion of the n type base layer in the active region; a gate insulating film which is formed on a front surface of the p type base layer between the n type source layer and the n type base layer; and a gate electrode on the gate insulating film, the gate electrode facing the n type source layer and the p type base layer via the gate insulating film, and, the active side p type layer may include a p type column layer which is formed in the n type base layer to be continuous to the p type base layer and extends from a front surface of the n type base layer to a rear surface of the n type base layer.

In one embodiment, the inactive side p type layer may include a p type guard ring surrounding the active region. In one embodiment, the p type guard ring may have the same depth as the depth of the p type column layer.

According to one embodiment of the present disclosure, there is provided a method for manufacturing a semiconductor device, comprising: forming an element structure including at least an active side p type layer to form a pn junction with an n type portion of an n type semiconductor layer including an active region and an inactive region, in the active region of the n type semiconductor layer; forming an inactive side p type layer to form a pn junction with the n type portion of the n type semiconductor layer, in the inactive region; forming a level difference on the rear surface of the n type semiconductor layer between the active region and the inactive region such that a level of the active region is lower than a level of the inactive region; irradiating charged particles over the entire rear surface of the n type semiconductor layer after forming the level difference; forming a first electrode to be electrically connected to the active side p type layer in a front surface of the n type semiconductor layer; and forming a second electrode to be electrically connected to the n type portion of the n type semiconductor layer in the rear surface of the n type semiconductor layer.

With this method, it is possible to manufacture the above-described semiconductor device. More specifically, when the charged particles are irradiated over the entire rear surface of the n type semiconductor layer where the level difference is formed, it is possible to form the level difference at the end of a range (implantation depth) of the charged particles in the active region and the inactive region. This level difference makes it possible to form the crystal defect region such that a depth position at which the crystal defect region is formed in the active region is different from a depth position at which the crystal defect region is formed in the inactive region. For example, with the irradiation of charged particles such as proton, $^3He^{++}$, $^4He^{++}$ or the like, crystal defects are induced in the vicinity of the range of ions (implantation depth of ions in the semiconductor substrate). Therefore, when the charged particles are irradiated after forming the level difference, it is possible to perform a lifetime control activation for any region.

In addition, this method can use the level difference formed in the semiconductor substrate to substantially perform a carrier lifetime control for a desired region in a relatively simple way and with a high precision of position alignment, without shielding a particle ray. If the particle ray is to be shielded by a mask, it is necessary to form a resist film, an insulating film and a metal film which will largely increase the thickness of the semiconductor substrate by, e.g., several tens of μm or more, which is impractical from the viewpoint of technical and productive efficiency. In addition, in a case where the particle ray is shielded by overlaying the semiconductor substrate with a metal plate which is cut to include an opening pattern, there is a problem of a remarkably poor precision of dimension or position alignment as compared to a semiconductor process keeping the precision at several μm or less. In other words, the method of present disclosure can make an improvement in the precision and productivity over the above-mentioned conventional methods.

In one embodiment, the act of forming the level difference may include: forming a mask having an opening on the active region, in the rear surface of the n type semiconductor layer; and forming a concave portion in the n type semiconductor layer by deep-etching the active region through the mask. With this method, since a large level difference (e.g., 10 μm or more) can be formed in the rear surface of the n type semiconductor layer, it is possible to reliably separate an active area and an inactive area for a carrier lifetime control from each other.

In this case, the method may further include: after irradiating the charged particles, grinding and flattening the rear surface of the n type semiconductor layer. This allows the second electrode to be advantageously formed for the rear surface of the n type semiconductor layer. In one embodiment, the act of forming the level difference may include: forming a first mask on the entire rear surface of the n type semiconductor layer; forming a second mask having an opening on the active region, on the first mask; and forming a level difference between the rear surface of the n type semiconductor layer and the remaining portion of the first mask by etching the first mask through the second mask.

With this method, since the etching of the first mask can be stopped at the rear surface of the n type semiconductor layer, it is possible to reduce a variation in depth at the bottom of the level difference. This can make a start point of implantation of the charged particles in the active region substantially constant, which can result in reduction of a variation in depth position of the active side crystal defect region. In one embodiment of the present disclosure, the method may further include: activating a crystal defect region with charged particles implanted into the n type semiconductor layer by subjecting the n type semiconductor layer to heat treatment at a predetermined first temperature. In this case, the first temperature may be 320 degrees C. to 380 degrees C.

In one embodiment of the present disclosure, the method may further include: after subjecting the n type semiconductor layer to heat treatment, forming a rear surface contact by implanting n type impurity ions into the rear surface of the n type semiconductor layer and activating an implantation portion of the n type impurity ions by heat treatment using laser annealing. Thus, by further activating the charged particles when forming the rear surface contact, it is possible to prevent a degree of diffusion of the crystal defect region from fluctuating.

In one embodiment of the present disclosure, the charged particles may include one of proton, $^3He^{++}$ and $^4He^{++}$.

BRIEF DESCRIPTION OF THE DRAWINGS

FIG. 3D is a view illustrating a step subsequent to the step of FIG. 3C.

FIG. 4A is a view illustrating a step in a process of manufacturing the semiconductor device.

FIG. 4C is a view illustrating a step subsequent to the step of FIG. 4B.

DETAILED DESCRIPTION

Some embodiments of the present disclosure will now be described in detail with reference to the accompanying drawings.

Figure 1:
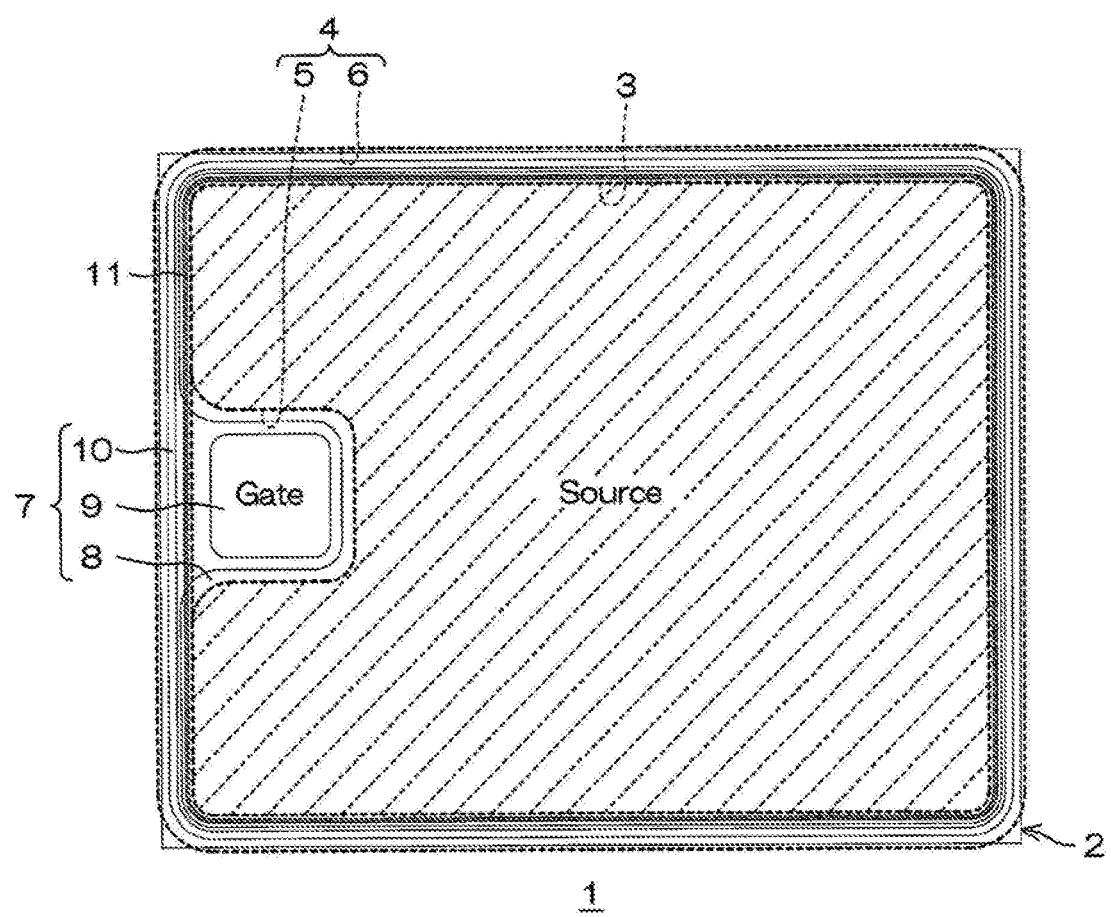
FIG. 1 is a schematic plan view of a semiconductor device according to one embodiment of the present disclosure.

FIG. 1 is a schematic plan view of a semiconductor device 1 according to one embodiment of the present disclosure. The semiconductor device 1 includes a semiconductor substrate 2 as one example of an n type semiconductor layer of the present disclosure. The semiconductor substrate 2 may be a Si substrate or other substrate used for a power device, such as a SiC substrate, a GaN substrate or the like. As shown in FIG. 1, the semiconductor substrate 2 may be rectangular, when viewed from top.

An active region 3 and an inactive region 4 surrounding the active region 3 are defined on the semiconductor substrate 2. The inactive region 4 may include a gate pad region 5 and a peripheral field region 6. The active region 3, the gate pad region 5 and the peripheral field region 6 are regions surrounded by thick broken lines, respectively, in FIG. 1. The peripheral field region 6 is formed in an annular shape along the periphery of the semiconductor substrate 2 and the active region 3 and the gate pad region 5 are defined in the inner region of the peripheral field region 6. The gate pad region 5 protrudes inward from the inner periphery of the peripheral field region 6.

An electrode film 7 is formed on the semiconductor substrate 2. The electrode film 7 is made of, e.g., aluminum or other metal. The electrode film 7 may include a source pad 8 on the active region 3, as one example of a first electrode of the present disclosure, a gate pad 9 on the gate pad region 5, and a field plate 10 on the peripheral field region 6. The source pad 8, the gate pad 9 and the field plate 10 are separated and electrically isolated from each other. A peripheral portion of the source pad 8 may be disposed in the side of the peripheral field region 6 from an interface (indicated by a thick broken line) between the active region 3 and the peripheral field region 6, as shown in FIG. 1. Thus, a portion of the source pad 8 is disposed above a p type guard ring 11 formed in the peripheral field region 6.

Figure 2:
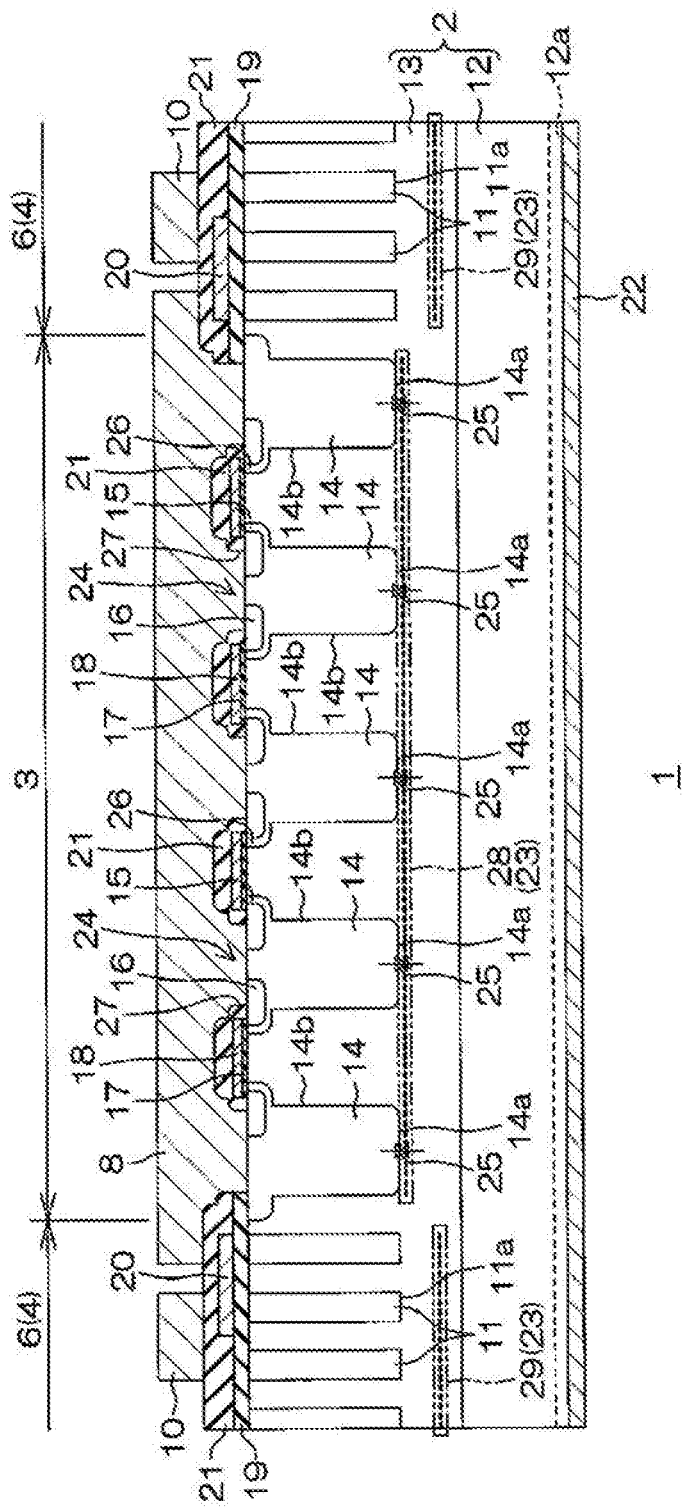
FIG. 2 is a sectional view illustrating main parts of the semiconductor device.

FIG. 2 is a sectional view illustrating main parts of the semiconductor device 1. FIG. 2 is also a schematic view for explaining the sectional structure of the semiconductor device 1 in detail but does not depict a cut section at a particular position of the semiconductor device 1 of FIG. 1. The semiconductor device 1 is an n channel type MISFET having a super junction structure. More specifically, the semiconductor device 1 includes an $n^+$ type drain layer 12, an n type base layer 13 as one example of an n type portion of the present disclosure, a p type column layer 14 and p type base layer 15 as one example of an active side p type layer of the present disclosure, an $n^+$ type source layer 16, a gate insulating film 17, a gate electrode 18, a p type guard ring 11 as one example of an inactive side p type layer of the present disclosure, a field insulating film 19, a field embedded electrode 20, an interlayer insulating film 21, a source pad 8, a field plate 10, a drain electrode 22 as one example of a second electrode of the present disclosure, and a crystal defect region 23.

The $n^+$ type drain layer 12 may be formed from an $n^+$ type semiconductor substrate (e.g., a silicon substrate). The $n^+$ type semiconductor substrate may be a semiconductor substrate in which crystals are grown while being doped with n type impurities such as phosphorus (P), arsenic (As), antimony (Sb) or the like. The $n^+$ type drain layer 12 may have a thickness of, e.g., 90 μm to 310 μm.

The n type base layer 13 may be a semiconductor layer doped with n type impurities, more specifically, an n type epitaxial layer epitaxial-grown while being doped with the n type impurities. As the n type impurities, the n type impurities as described above may be used. In other words, the semiconductor substrate 2 of FIG. 1 may be an epitaxial substrate including the $n^+$ type drain layer 12 (a base substrate) and the n type base layer 13 (an epitaxial layer) formed thereon. The n type base layer 13 may have a thickness of, e.g., 40 μm to 60 μm. Therefore, the total thickness of the semiconductor substrate 2 including the $n^+$ type drain layer 12 and the n type base layer 13 may be, e.g., 150 μm to 350 μm.

The p type column layer 14 and the p type base layer 15 may be a semiconductor layer doped with p type impurities, more specifically, a semiconductor layer formed by implanting ions of p type impurities such as boron (B), aluminum (Al), gallium (Ga) or the like into the n type base layer 13. The p type base layer 15 may be selectively formed on a surficial layer portion of the n type base layer 13 in a plurality of regions which are discretely arranged periodically in plan view of the semiconductor device 1. A region including each p type base layer 15 and an n type base layer 13 therearound may form a unit cell 24. The semiconductor device 1 may have a number (plurality) of unit cells 24 arranged in the form of a lattice in plan view of the semiconductor device 1.

The p type column layer 14 may be formed in an inner region of the p type base layer 15 of each unit cell 24 in plan view. More specifically, the p type column layer 14 may be formed in a shape, e.g., similar to the shape of the p type base layer 15 in substantially the central region of the p type base layer 15 when viewed from top. The p type column layer 14 is formed so as to be continuous to the p type base layer 15 and may extend toward the n$^+$ type drain layer 12 up to a position deeper than the p type base layer 15 in the n type base layer 13. In other words, the p type column layer 14 may be formed substantially in a columnar shape. In addition, the shape of the p type column layer 14 is not limited to the columnar shape but may have, e.g., a stripe shape when viewed from top. The bottom 14a of the p type column layer 14 may be located at a position nearer to the n$^+$ type drain layer 12 than the center in the thickness direction of the n type base layer 13. The depth of the p type column layer 14 may be smaller by about 15 μm than the thickness of the n type base layer 13, for example, 25 μm to 45 μm. The bottom 14a of the p type column layer 14 (an interface with the n type base layer 13) faces the front surface (the upper surface in FIG. 2) of the n$^+$ type drain layer 12 with the n type base layer 13 sandwiched therebetween in the thickness direction. In addition, a side 14b of the p type column layer 14 (an interface with the n type base layer 13) faces a side 14b of another adjacent p type column layer 14 with the n type base layer 13 sandwiched therebetween.

An interface between the n type base layer 13 and the p type base layer 15 and the p type column layer 14 is a pn junction and forms a parasitic diode (body diode) 25. The n$^+$ type source layer 16 may be formed in the inner region of the p type base layer 15 of each unit cell 24. The n$^+$ type source layer 16 may be selectively formed on a surficial layer portion of the p type base layer 15 in the corresponding region. The n$^+$ type source layer 16 may be formed by selectively implanting ions of the n type impurities into the p type base layer 15. The n type impurities may be the n type impurities as described above. The n$^+$ type source layer 16 is formed within the p type base layer 15 so as to be positioned inward by a predetermined distance from an interface between the p type base layer 15 and the n type base layer 13. Thus, in a surficial layer region of the semiconductor layer including the n type base layer 13, the p type base layer 15 and so on, the surficial layer portion of the p type base layer 15 is interposed between the n$^+$ type source layer 16 and the n type base layer 13. The interposed surficial layer portion forms a channel region 26. The n$^+$ type source layer 16 may be formed in a region extending from the inside to the outside of the side 14b of the p type column layer 14.

The gate insulating film 17 may be formed of, e.g., a silicon oxide film, a silicon nitride film, a silicon oxynitride film, a hafnium oxide film, an alumina film or a tantalum oxide film. The gate insulating film 17 is formed so as to cover the front surface of the p type base layer 15 at least in the channel region 26. In this embodiment, the gate insulating film 17 is formed so as to cover a portion of the n$^+$ type source layer 16, the channel region 26 and the front surface of the n type base layer 13. More plainly, the gate insulating film 17 is formed in a pattern having an opening in the central region of the p type base layer 15 in each unit cell 24 and the inner edge region of the n+ type source layer 16 continuous to the central region. The gate insulating film 17 may have a thickness of, e.g., 0.005 μm to 0.03 μm.

The gate electrode 18 is formed so as to face the channel region 26 via the gate insulating film 17. The gate electrode 18 may be made of, e.g., polysilicon having resistance decreased by being doped with impurities. In this embodiment, the gate electrode 18 is formed in substantially the same pattern as the gate insulating film 17 and covers the front surface of the gate insulating film 17. In other words, the gate electrode 18 is disposed above a portion of the n$^+$ type source layer 16, the channel region 26 and the front surface of the n type base layer 13. More plainly, the gate electrode 18 is formed in a pattern having an opening in the central region of the p type base layer 15 in each unit cell 24 and the inner edge region of the n+ type source layer 16 continuous to the central region. In other words, the gate electrode 18 is formed to control a plurality of unit cells 24 in common.

The p type guard ring 11 may be a semiconductor layer doped with p type impurities, more specifically, a semiconductor layer formed by doping the n type base layer 13 with the p type impurities. As the p type impurities, the above-mentioned p type impurities may be used. The p type guard ring 11 may be a closed region surrounding the active region 3 when viewed from top (see FIG. 1). The p type guard ring 11 may be plural as shown in FIG. 2 or may be singular. The p type guard ring 11 extends toward the n$^+$ type drain layer 12 up to a position deeper than the bottom of the p type base layer 15 in the n type base layer 13. More specifically, the p type guard ring 11 may have the same depth as the depth of the p type column layer 14.

The field insulating film 19 may be formed of, e.g., a silicon oxide film, a silicon nitride film, a silicon oxynitride film, a hafnium oxide film, an alumina film or a tantalum oxide film. The field insulating film 19 is formed so as to cover at least a plurality of p type guard rings 11. The field insulating film 19 is thicker than the gate insulating film 17 and may have a thickness of, e.g., 1 μm to 7 μm.

The field embedded electrode 20 may be formed so as to face the p type guard ring 11 via the field insulating film 19. For example, the field embedded electrode 20 may be formed so as to selectively face at least one of a plurality of p type guard rings 11 (e.g., at least the innermost peripheral p type guard ring 11 and a p type guard ring 11 adjacent to the innermost peripheral p type guard ring 11 from outside) and not to face the remaining p type guard rings 11. The field embedded electrode 20 may be made of, e.g., polysilicon having resistance decreased by being doped with impurities. The field embedded electrode 20 may be formed in the same step as the gate electrode 18. The field embedded electrode 20 may be fixed to a source potential at a position (not shown).

The interlayer insulating film 21 may be formed of, e.g., an insulating material such as a silicon oxide film, a silicon nitride film, tetraethoxysilane (TEOS) or the like. The interlayer insulating film 21 covers an upper surface and side surfaces of the gate electrode 18 and an upper surface and side surfaces of the field embedded electrode 20 and is formed in a pattern having contact holes 27 in the central region of the p type base layer 15 in each unit cell 24 and the inner edge region of the n$^+$ type source layer 16 continuous to the central region.

The source pad 8 is formed so as to cover the front surface of the interlayer insulating film 21 and to be embedded in the contact holes 27 of each unit cell 24. Thus, the source pad 8 is in ohmic contact with the n$^+$ type source layer 16. Therefore, the source pad 8 is connected in parallel to the plurality of unit cells 24 and is configured such that the total current is flown into the plurality of unit cells 24. In addition, the source pad 8 is in ohmic contact with the p type base layer 15 of each unit cell 24 via the contact holes 27 and stabilizes the potential of the p type base layer 15.

The field plate 10 is formed on the front surface of the interlayer insulating film 21. The field plate 10 may face the field embedded electrode 20 via the interlayer insulating film 21. The drain electrode 22 is made of metal such as aluminum or the like. The drain electrode 22 is formed on the rear surface of the n$^+$ type drain layer 12 (a surface in the opposite side to the n type base layer 13, or the lower surface in FIG. 2). Thus, the drain electrode 22 is connected in parallel to the plurality of unit cells 24 and is configured such that the total current is flown into the plurality of unit cells 24. A rear surface contact region 12a having a selective high n type impurity concentration may be formed in the vicinity of an interface with the drain electrode 22 of the n$^+$ type drain layer 12.

With the drain electrode 22 set to a higher potential in comparison to a potential of the source pad 8, when a power supply is connected between the source pad 8 and the drain electrode 22, a reverse bias is applied to the parasitic diode 25. At this time, when a control voltage lower than a predetermined threshold voltage is applied to the gate electrode 18, no current path is formed between the drain and the source. In other words, the semiconductor device 1 is in a turn-off state. On the other hand, when a control voltage equal to or higher than the threshold voltage is applied to the gate electrode 18, electrons are attracted to the front surface of the channel region 26, thereby forming an inversion layer (channel). Thus, conduction is made between the n$^+$ type source layer 16 and the n type base layer 13. In other words, a current path ranging from the source pad 8 to the drain electrode 22 through the n$^+$ type source layer 16, the inversion layer of the channel region 26, the n type base layer 13 and the n$^+$ type drain layer 12 in this order is formed.

When the semiconductor device 1 is applied to an inverter circuit for driving an inductive load such as an electric motor or the like, there is a case where the source pad 8 has a higher potential than the drain electrode 22 and a forward current flows in the parasitic diode 25. Thereafter, when the source pad 8 has a lower potential than the drain electrode 22, the parasitic diode 25 enters a reverse bias state. At this time, a depletion layer is spread from the pn junction of the parasitic diode 25, carriers (holes) injected into the n type base layer 13 are moved to the source pad 8, and carriers (electrons) injected into the p type base layer 15 and the p type column layer 14 are moved to the drain electrode 22. According to such movement of carriers, a reverse recovery current flows. This reverse recovery current once increases and thereafter decreases. Time taken until the magnitude of the reverse recovery current decreases to 10% of its maximum value after the forward current of the diode becomes 0 (zero) is called "reverse recovery time."

The crystal defect region 23 contributes to a reduction of the reverse recovery time. The crystal defect region 23 is a region formed by irradiating charged particles, starting from the n$^+$ type drain layer 12. A lot of recombination centers to be lost by trapping and recombining carriers exist in the crystal defect region 23. Therefore, since carriers can be quickly lost to shorten a carrier lifetime when the reverse recovery effect occurs, it is possible to reduce the reverse recovery time and the reverse recovery current.

The crystal defect region 23 is locally formed to be spread thinly (e.g., with a thickness of 10 μm to 15 μm) at a predetermined depth position from the rear surface of the n+ type drain layer 12 (an interface with the drain electrode 22) within the n type base layer 13. The thickness of the crystal defect region 23 in the depth direction is determined depending on, e.g., ion species, irradiation energy and so on. For example, a half thickness of the crystal defect region 23 is about 10 μm for $^3$He$^{++}$ (24 MeV). The crystal defect region 23 includes an active side crystal defect region 28 and an inactive side crystal defect region 29 which are at different depths (from the rear surface of the n$^+$ type drain layer 12) within the n type base layer 13.

The active side crystal defect region 28 is located near the bottom 14a of the p type column layer 14. The active side crystal defect region 28 may be in contact with the bottom 14a of the p type column layer 14 or may be located between the bottom 14a of the p type column layer 14 while the n$^+$ type drain layer 12 does not make contact with the p type column layer 14. In some embodiments, a distance from a half thickness position of the active side crystal defect region 28 in its thickness direction to the bottom 14a of the p type column layer 14 may be shorter than a distance from a middle position in the thickness direction between the bottom 14a of the p type column layer 14 and the front surface the n$^+$ type drain layer 12 and the bottom 14a of the p type column layer 14. More specifically, the half thickness position of the active side crystal defect region 28 may be located within 5 μm from the bottom 14a of the p type column layer 14. The location of the active side crystal defect region 28 close to the bottom 14a of the p type column layer 14 is effective in reducing the reverse recovery time, whereas the location of the active side crystal defect region 28 distant from the bottom 14a of the p type column layer 14 is effective in reducing a drain-source leak current.

Thereafter, the inactive side crystal defect region 29, which has no direct contribution to the turn-on operation of the semiconductor device 1 and faces the p type guard ring 11, is located away from the bottom 11a of the p type guard ring 11. In some embodiments, a distance from a half thickness position of the inactive side crystal defect region 29 in its thickness direction to the n$^+$ type drain layer 12 is shorter than a distance from a middle position in the thickness direction between the bottom 11a of the p type guard ring 11 and the surface of the n$^+$ type drain layer 12 to the n$^+$ type drain layer 12. More specifically, the half thickness position of the inactive side crystal defect region 29 may be formed to be separated from the bottom 11a of the p type guard ring 11 by 10 μm or more. Thus, in the inactive region 4, it is possible to suppress an effect caused by forming the crystal defect region 23 and reduce the drain-source leak current, thereby preventing a breakdown voltage of the semiconductor device 1 from decreasing. In addition, although not shown in FIG. 2, the inactive side crystal defect region 29 may be located below the gate pad region 5 of FIG. 1.

The crystal defect region 23 can be formed by irradiating protons or charged particles such as $^3$He$^{++}$, $^4$He$^{++}$ or the like. In particular, helium atom nuclei ($^3$He$^{++}$ or $^4$He$^{++}$), which is larger in mass, may be used since they can narrow a distribution range of a crystal defect generation layer in its thickness direction and can locally distribute the crystal defect generation layer in a narrow range in the thickness direction.

Next, a method of manufacturing the semiconductor device 1 will be described in detail. Although this embodiment employs a first method shown in FIGS. 3A to 3E and a second method shown in FIGS. 4A to 4E, the method of manufacturing the semiconductor device 1 is not limited thereto.

<First Method>

FIGS. 3A to 3E are views illustrating some sequential steps in a process of manufacturing the semiconductor device 1.

Figure 3A:
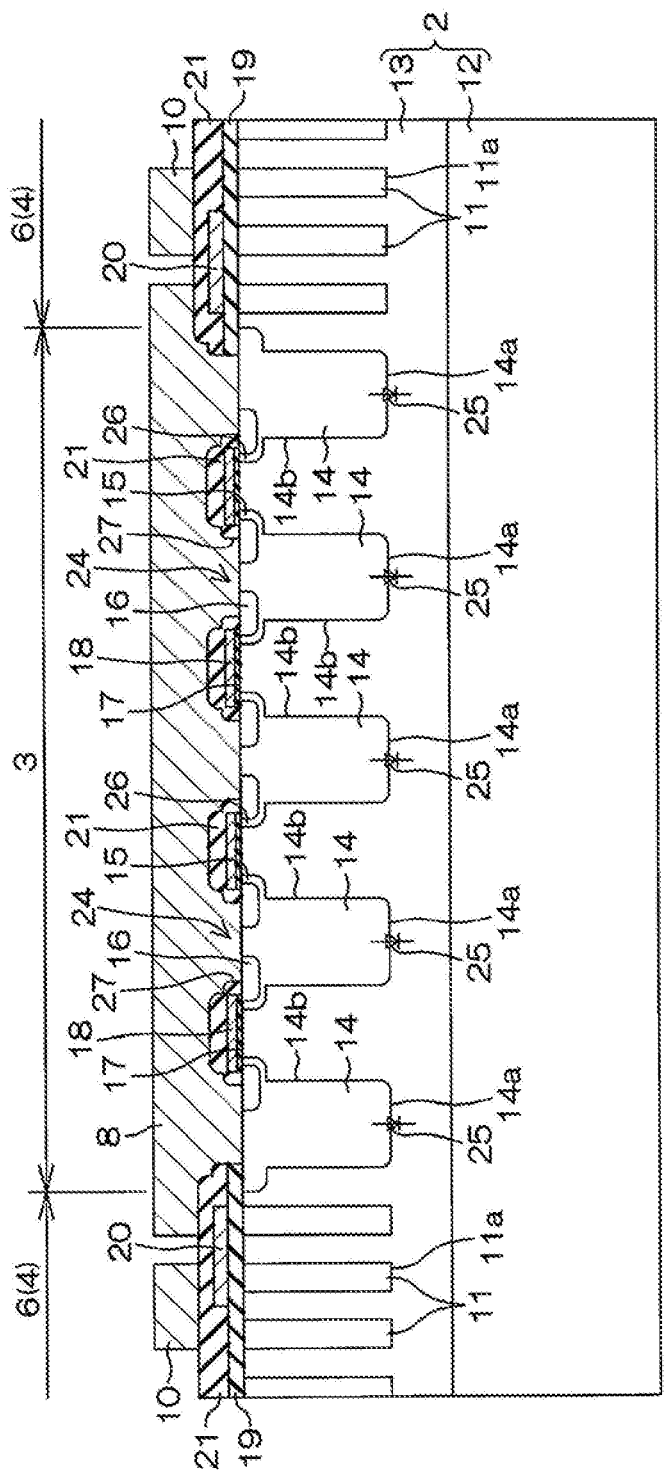
FIG. 3A is a view illustrating a step in a process of manufacturing the semiconductor device.

First, as illustrated in FIG. 3A, an MISFET structure is formed on a surficial layer portion of the semiconductor substrate 2. At this time, the p type column layer 14 and the p type guard ring 11 may be formed in the same ion implantation step. Next, the n+ type drain layer 12 (base substrate) of the semiconductor substrate 2 is thinned by grinding, starting from its rear surface side, as necessary. The grinding amount is not particularly limited but may be such an amount that the n+ type drain layer 12 has a thickness of 250 μm to 350 μm after being ground. When the thickness after being ground falls within this range, it is easy to secure an absorber thickness for precise control (e.g., control by 1 μm) of the range of charged particles.

Figure 3B:
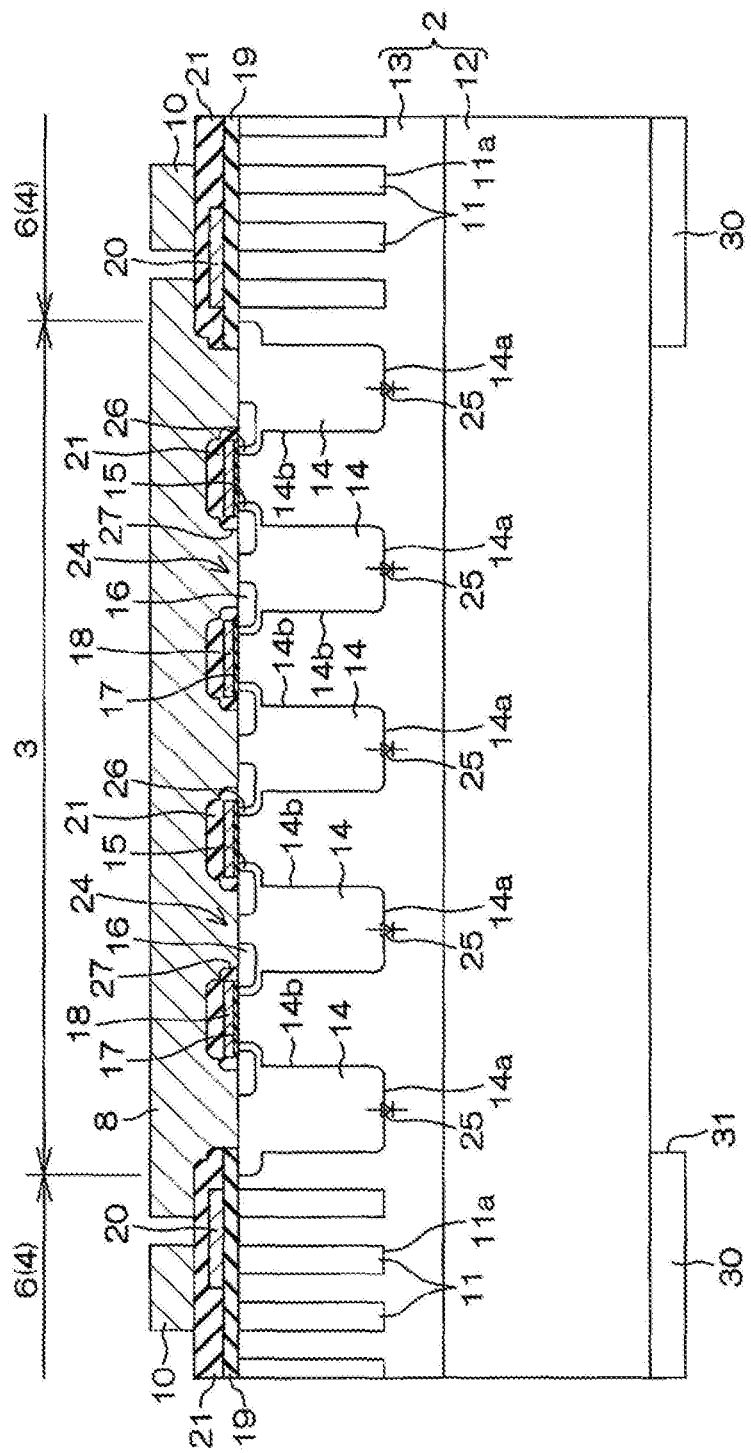
FIG. 3B is a view illustrating a step subsequent to the step of FIG. 3A.

Subsequently, as illustrated in FIG. 3B, a resist film 30 as one example of a mask of the present disclosure which covers the inactive region 4 and has an opening 31 on the active region 3 is formed on the rear surface of the semiconductor substrate 2. The opening 31 selectively exposes the active region 3, for example as indicated by a broken line hatching in FIG. 1. Therefore, the gate pad region 5 and the peripheral field region 6 are in a state of being covered by the resist film 30.

In addition, prior to the formation of the resist film 30, a protective film (not shown) may be formed on the front surface of the semiconductor substrate 2. By forming the protective film, the MISFET structure on the front surface can be protected from an etching step shown in FIG. 3C. For example, a resist film may be used as such a protective film. More specifically, when a positive resist film is entirely coated and developed on the front surface and the same film as the positive resist film is used as the resist film 30, the resist film may not be removed from the front surface when forming the opening 31.

Figure 3C:
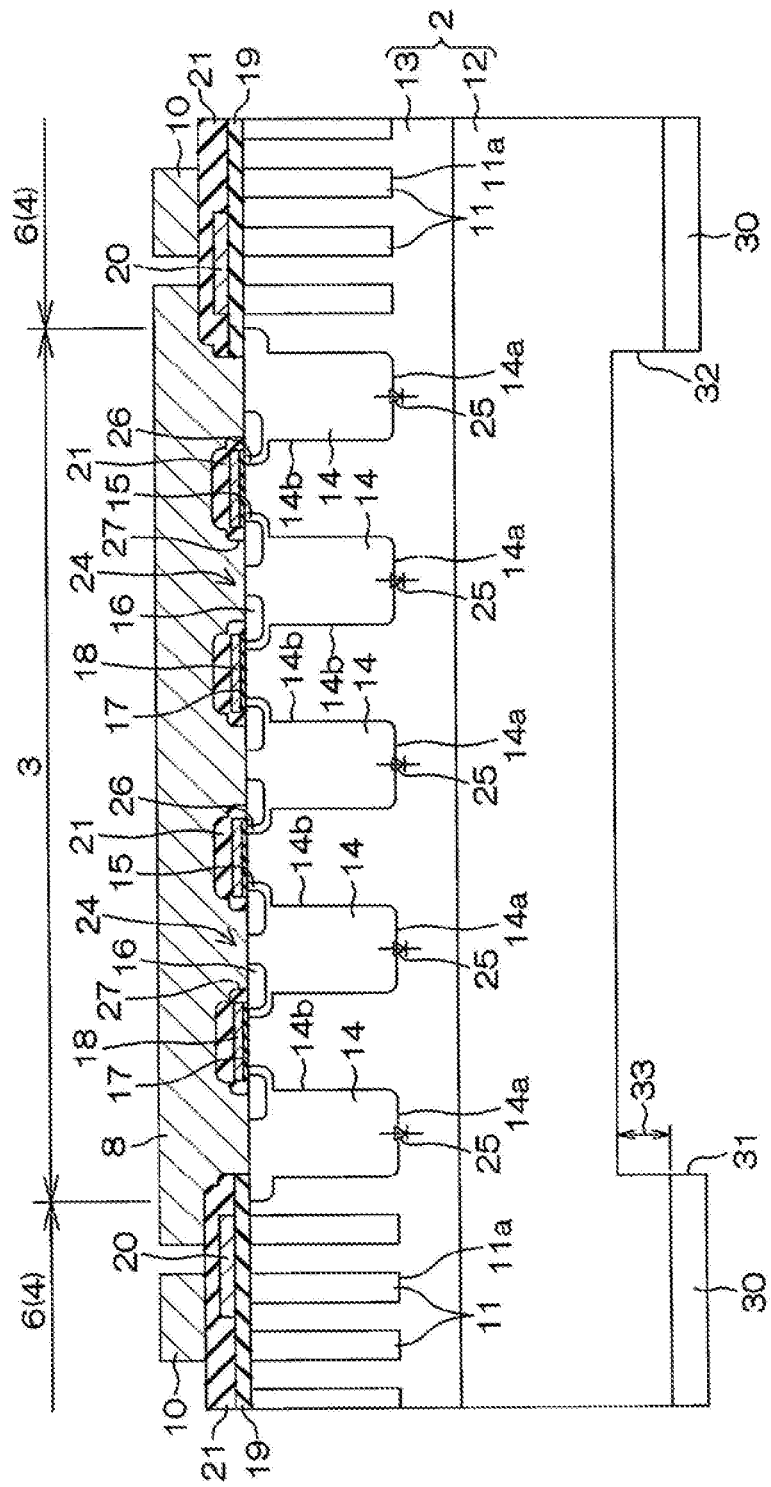
FIG. 3C is a view illustrating a step subsequent to the step of FIG. 3B.

Subsequently, as illustrated in FIG. 3C, the semiconductor substrate 2 is etched through the resist film 30. This etching is performed by deep etching and an aimed depth may range from, e.g., 10 μm to 100 μm. In some embodiments, the aimed depth may be sufficiently larger than a half thickness of the range of irradiated charged particles. Thus, a concave portion 32 is formed in the semiconductor substrate 2 (the n+ type drain layer 12). The depth of the concave portion 32 provides a level difference 33 between the active region 3 (the bottom of the concave portion 32) and the inactive region 4 (the rear surface other than the concave portion 32) in the rear surface of the semiconductor device 2. Thereafter, the resist film 30 and the protective film (not shown) on the front surface of the semiconductor substrate 2 are removed.

Subsequently, as illustrated in FIG. 3D, the irradiation of charged particles is performed, starting from the n+ type drain layer 12 side. Examples of the charged particles irradiated at this time may include protons, $^3$He$^{++}$ and $^4$He$^{++}$. The range (implantation depth) of the charged particles is determined, e.g., with a priority put on the position of the active side crystal defect region 28. An absorber for decreasing acceleration energy of the charged particle ions or energy of the charged particle ions is adjusted to allow the active side crystal defect region 28 to be formed in the vicinity of the bottom 14a of the p type column layer 14. For example, the irradiation energy of the charged particles (e.g., $^3$H$^{++}$) may be about 15 MeV to 30 MeV. For example, the typical helium ion energy by cyclotron is 10 MeV to 100 MeV. In addition, a dose of the charged particles (e.g., $^3$H$^{++}$) may be, e.g., about $1\times10^{11}$/cm$^2$ to $1\times10^{13}$/cm$^2$. Thus, the crystal defect region 23 is formed.

Figure 3E:
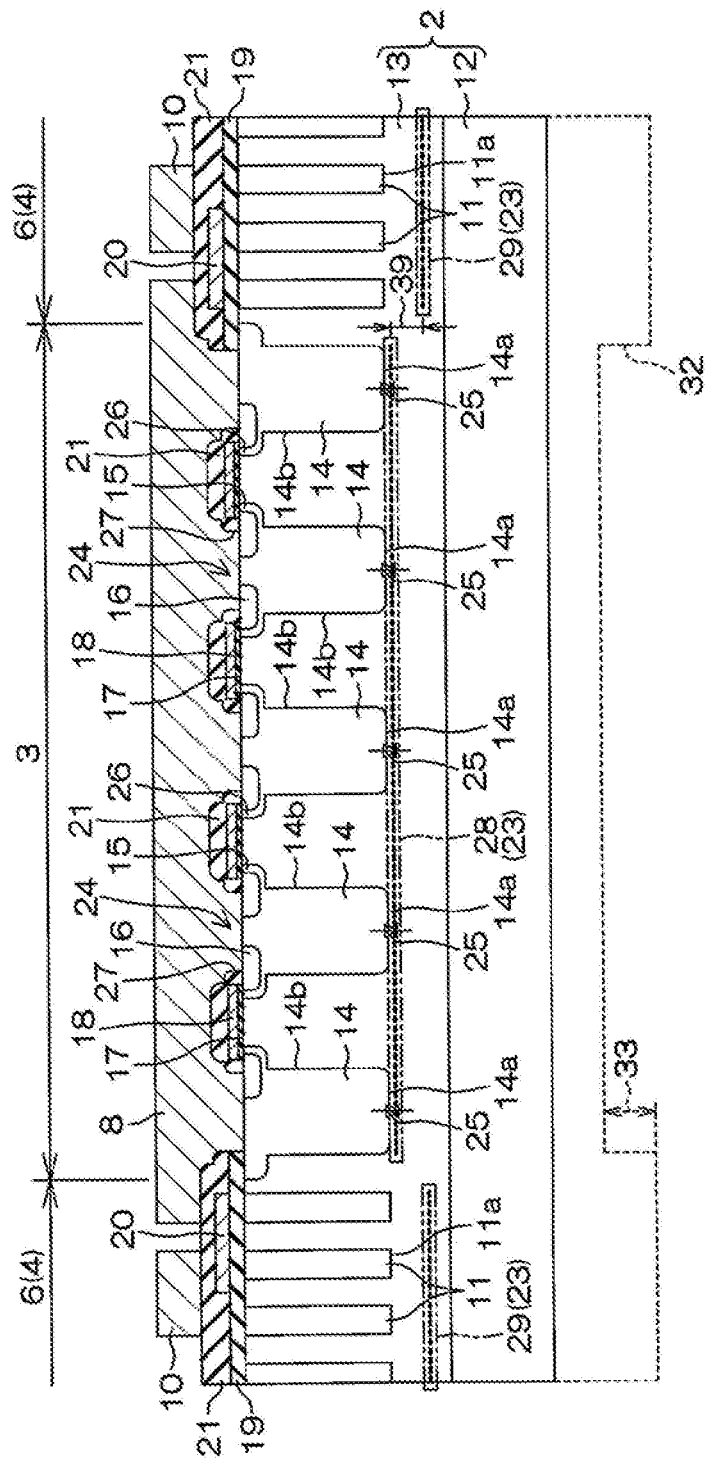
FIG. 3E is a view illustrating a step subsequent to the step of FIG. 3D.

Subsequently, as illustrated in FIG. 3E, the n+ type drain layer 12 (base substrate) of the semiconductor substrate 2 is ground and flattened, starting from its rear surface. The grinding amount is not particularly limited as long as it can remove the level difference 33 and flatten the rear surface, but may be such an amount that the n+ type drain layer 12 has a thickness of 90 μm to 310 μm after being ground.

Subsequently, for example, heat treatment at a low temperature as one example of a first temperature of the present disclosure (low temperature annealing) is performed. Thus, the irradiated charged particles are donorized (activated). When $^3$H$^{++}$ is selected as the charged particles, the introduced $^3$He$^{++}$ can be donorized by heat treatment at, e.g., about 320 degrees C. to 380 degrees C. (e.g., 350 degrees C.) for, e.g., about 30 minutes to 90 minutes (e.g., 60 minutes).

In this embodiment, by irradiating a particle ray over the entire rear surface of the n+ type drain layer 12 in which the level difference 33 is formed, it is possible to form a level difference 39 between the active side crystal defect region 28 and the inactive side crystal defect region 29 in the active region 3 and the inactive region 4 with the particle ray of the same range. Therefore, it is possible to reliably separate an active area (the active side crystal defect region 28) to control the carrier lifetime from an inactive area (the inactive side crystal defect region 29).

This embodiment is characterized by using the level difference 33 formed in the semiconductor substrate by a semiconductor process to substantially separate a carrier lifetime control active area from a carrier lifetime control inactive area in a relatively simple way and with high precision of position alignment, without shielding the carrier lifetime control inactive area from the particle ray. If the carrier lifetime control inactive area is to be shielded by a mask, it is necessary to form a resist film, an insulating film and a metal film which will largely increase the thickness of the semiconductor substrate by, e.g., several tens of μm or more, which is impractical from the viewpoint of technical and productive efficiency. In addition, in a case where the particle ray is shielded by overlaying the semiconductor substrate with a metal plate which is cut to include an opening pattern, there is a problem of a remarkably poor precision of dimension or position alignment as compared to a semiconductor process keeping the precision at several μm or less. Meanwhile, in this embodiment, since the resist film 30 is patterned by photolithography in order to separate the carrier lifetime control active area (the active side crystal defect region 28) from the carrier lifetime control inactive area (the inactive side crystal defect region 29), the areas can be designated with the precision of several μm or less. In addition, since an existing semiconductor device manufacturing apparatus may be used, such method is especially reasonable and useful in respect of productivity.

Thereafter, implantation of n type impurities (e.g., As) is performed, starting from the n+ type drain layer 12, and, subsequently, heat treatment is performed at a low temperature as one example of a second temperature of the present disclosure which is lower than the activation temperature (e.g., 320 degrees C. to 350 degrees C.) of the charged particles. One example of such heat treatment may include a method of laser annealing. Thus, the implanted n type impurities are donorized (activated) to form the rear surface contact region 12a (not shown). By making the heat treatment temperature at this time lower than the activation temperature of the charged particles, the charged particles can further be activated when forming the rear surface contact region 12a, thereby preventing the degree of diffusion of the crystal defect region 23 from fluctuating. The drain electrode 22 is formed after forming the rear surface contact region 12a. The semiconductor device 1 can be obtained through the above-described process.

<Second Method>

FIGS. 4A to 4E are views illustrating some sequential steps in a process of manufacturing the semiconductor device 1.

First, as illustrated in FIG. 4A, the same step as FIG. 3A is performed. In other words, an MISFET structure is formed on a surficial layer portion of the semiconductor substrate 2. Subsequently, the n⁺ type drain layer 12 (base substrate) of the semiconductor substrate 2 is thinned by grinding, starting from its rear surface side, as necessary. The grinding amount may be the same as one described above.

Figure 4B:
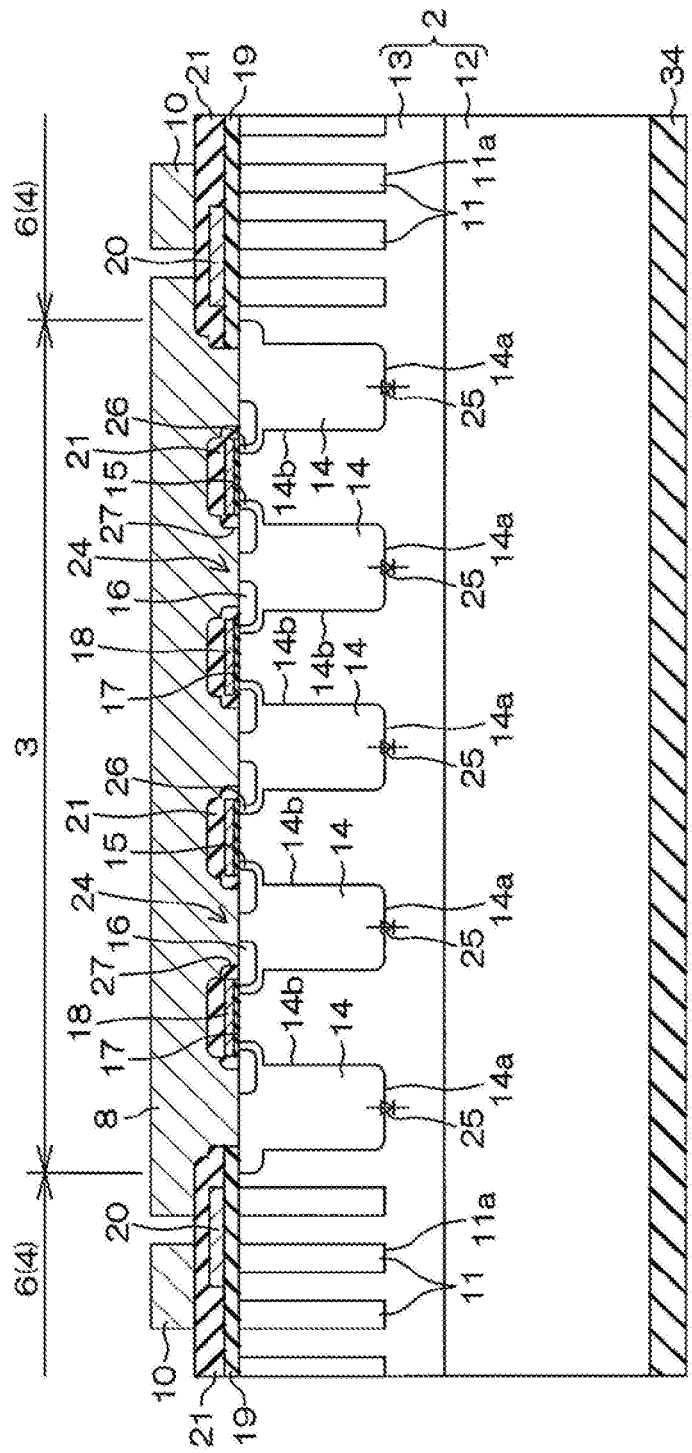
FIG. 4B is a view illustrating a step subsequent to the step of FIG. 4A.

Subsequently, as illustrated in FIG. 4B, an insulating film 34 as one example of a first mask of the present disclosure is formed on the entire rear surface of the n⁺ type drain layer 12, for example by a CVD method. The insulating film 34 may be formed of, e.g., a silicon oxide film, a silicon nitride film or the like. The thickness of the insulating film 34 may be, e.g., 5 μm to 10 μm.

Subsequently, as illustrated in FIG. 4C, a resist film 35 as one example of a second mask of the present disclosure which covers the inactive region 4 and has an opening 36 on the active region 3 is formed on the insulating film 34. The opening 36 selectively exposes the active region 3, for example as indicated by a broken line hatching in FIG. 1. Therefore, the insulating film 34 on the gate pad region 5 and the peripheral field region 6 is in a state of being covered with the resist film 35. Further, in this case, in the same manner as described above, prior to forming the resist film 35, a protective film (not shown) may be formed on the front surface of the semiconductor substrate 2.

Subsequently, the insulating film 34 is etched through the resist film 35. This etching is performed up to the rear surface of the semiconductor substrate 2 (the n⁺ type drain layer 12). Thus, an opening 37 is formed in the insulating film 34. This opening 37 provides a level difference 38 between the active region 3 (the bottom of the e opening 37, that is, the rear surface of the n⁺ type drain layer 12) and the inactive region 4 (the rear surface of the insulating film 34) in the rear surface of the semiconductor device 2. The level difference 38 is equal to the thickness of the insulating film 34. Thereafter, the resist film 35 and the protective film (not shown) on the front surface of the semiconductor substrate 2 are removed.

Figure 4D:
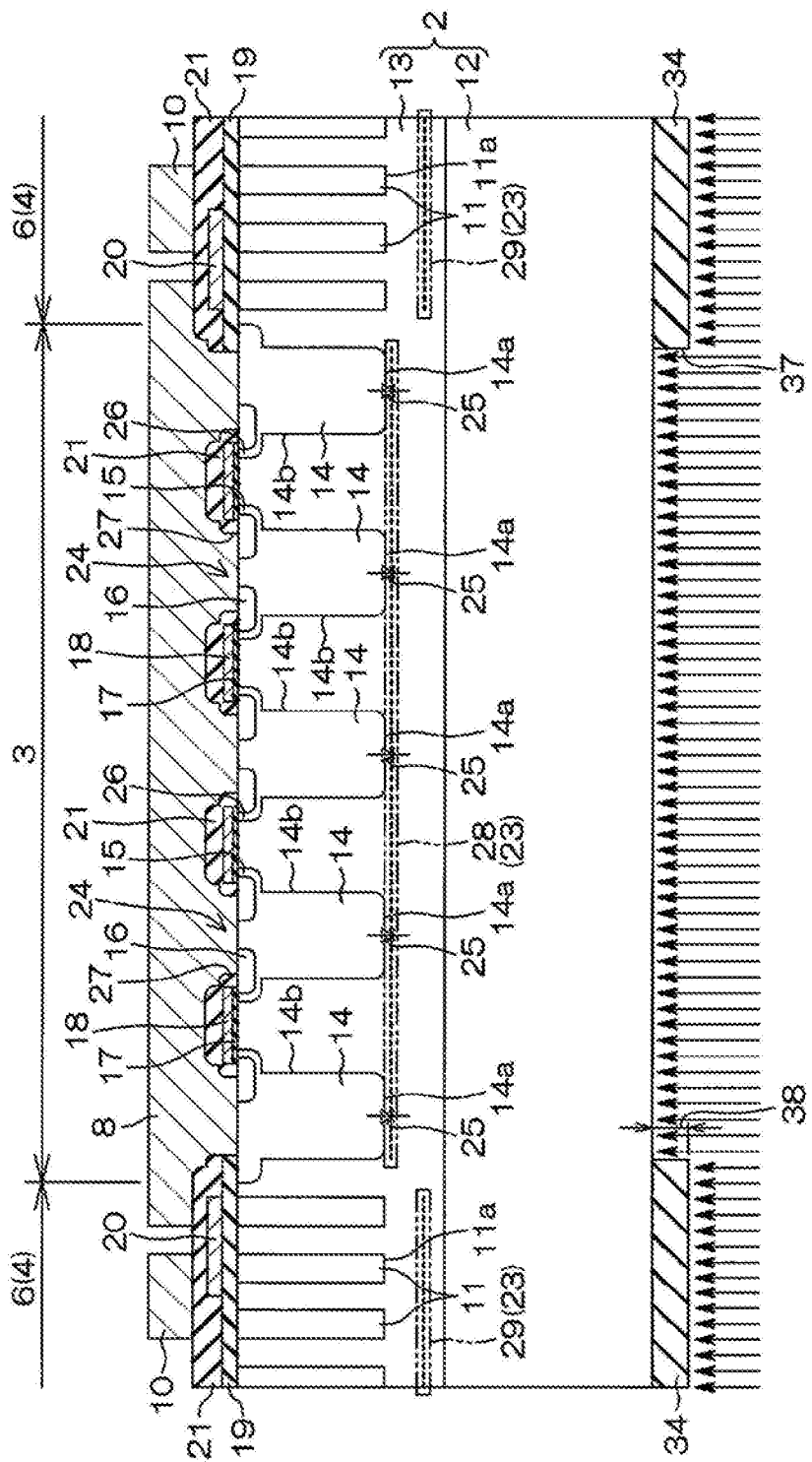
FIG. 4D is a view illustrating a step subsequent to the step of FIG. 4C.

Subsequently, as illustrated in FIG. 4D, the irradiation of charged particles is performed, starting from the n⁺ type drain layer 12 side. Examples of the charged particles irradiated at this time may include protons, ³He⁺⁺ and ⁴He⁺⁺. The range (implantation depth) of the charged particles is determined, e.g., with a priority put on the position of the active side crystal defect region 28. An absorber for decreasing acceleration energy of the charged particle ions or energy of the charged particle ions is adjusted to allow the active side crystal defect region 28 to be formed in the vicinity of the bottom 14a of the p type column layer 14. For example, the irradiation energy of the charged particles (e.g., ³H⁺⁺) may be about 15 MeV to 30 MeV. In addition, a dose of the charged particles (e.g., ³H⁺⁺) may be, e.g., about $1\times10^{11}/cm^2$ to $1\times10^{13}/cm^2$. Thus, the crystal defect region 23 is formed.

Figure 4E:
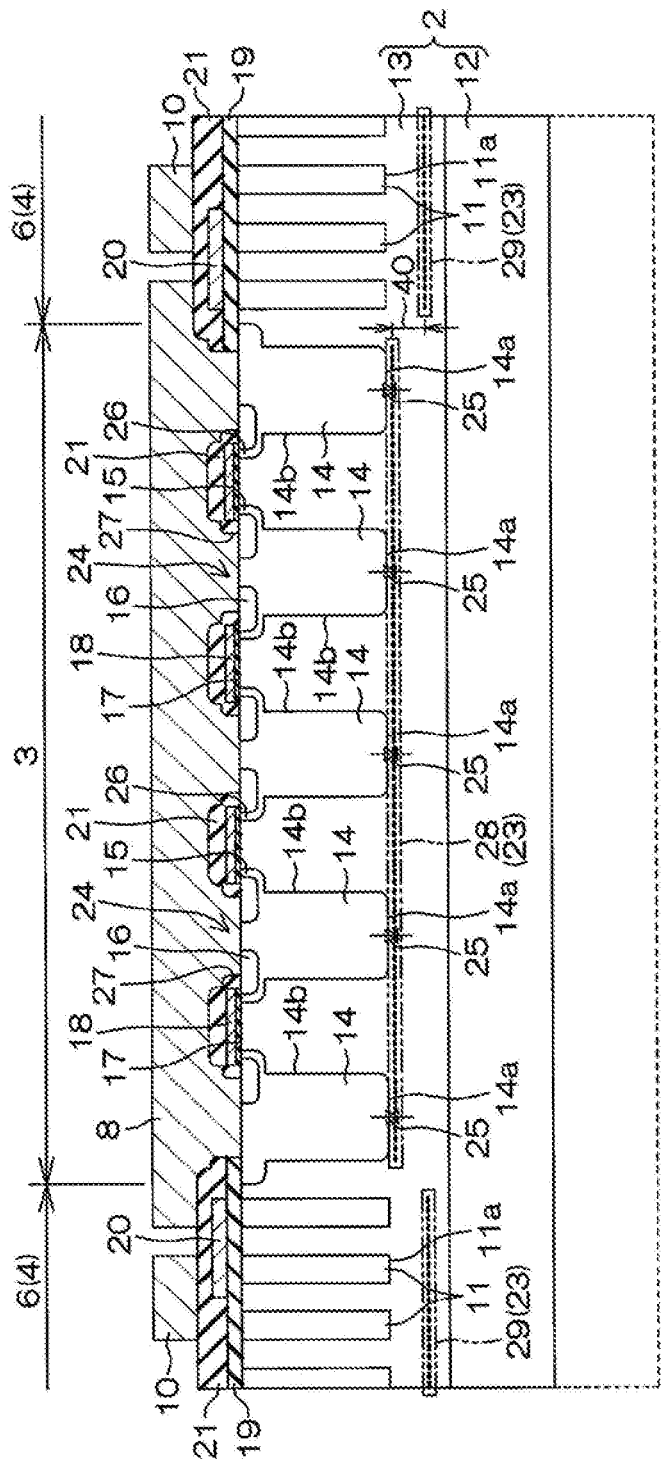
FIG. 4E is a view illustrating a step subsequent to the step of FIG. 4D.

Subsequently, as illustrated in FIG. 4E, the n⁺ type drain layer 12 (base substrate) of the semiconductor substrate 2 is ground and flattened, starting from its rear surface. The grinding amount is not particularly limited but may be such an amount that the n⁺ type drain layer 12 has a thickness of 90 μm to 310 μm after being ground.

Subsequently, in the same manner as described above, heat treatment is performed at a low temperature as one example of a first temperature of the present disclosure (low temperature annealing). Thus, the irradiated charged particles are donorized (activated).

In this embodiment, by irradiating a particle ray over the entire rear surface of the n⁺ type drain layer 12 in which the level difference 38 is formed, it is possible to form a level difference 40 between the active side crystal defect region 28 and the inactive side crystal defect region 29 in the active region 3 and the inactive region 4 with the particle ray of the same range. This level difference 40 makes it possible to form the active side crystal defect region 28 and the inactive side crystal defect region 29 at different depths within the n type base layer 13 in the active region 3 and the inactive region 4, respectively. Moreover, when forming the level difference 38, since the etching of the insulating film 34 can be stopped at the rear surface of the n⁺ type drain layer 12, it is possible to reduce a variation in depth at the bottom of the level difference 38. This can make a start point of implantation of the charged particles in the active region 3 substantially constant, which can result in reduction of a variation in depth position of the active side crystal defect region 28.

In addition, this embodiment eliminates a need to completely shield the implantation of the charged particles into the inactive region 4 since it is not the case that only the active region 3 is selectively irradiated with the charged particles. Therefore, in the same manner as described above, it is possible to eliminate the unreasonableness and usefulness in respect of productivity.

Thereafter, in the same manner as described above, the implantation of n type impurities (e.g., As) is performed, starting from the n⁺ type drain layer 12 side, and, subsequently, heat treatment is performed at a low temperature as one example of a second temperature of the present disclosure which is lower than the activation temperature (e.g., 320 degrees C. to 350 degrees C.) of the charged particles. Thus, the implanted n type impurities are donorized (activated) to form the rear surface contact region 12a (not shown). The drain electrode 22 is formed after forming the rear surface contact region 12a. The semiconductor device 1 can be obtained through the above-described process.

While one embodiment of the present disclosure has been described in the above, the present disclosure may be practiced in different forms. For example, an alpha ray, heavy metal or the like may be used as particles for forming the crystal defect region 23. In addition, an element structure formed on the semiconductor substrate 2 is not limited to a vertical MISFET structure but may be, e.g., a vertical IGBT, a pn diode or the like. For the vertical IGBT, in the same manner as described above, the active side crystal defect region 28 may be formed in the vicinity of a parasitic diode. For the pn diode, the active side crystal defect region 28 may be formed in the vicinity of a pn junction of the pn diode.

Further, various modifications and changes in design are possible without departing from the scope defined in the claims.

EXAMPLES

Next, verification on the following points was made in order to demonstrate the operation and effects of the present disclosure.

(1) Variation of Peak Breakdown Voltage with Respect to Ion Stop Position

This is to verify that the breakdown voltage of the semiconductor device 1 can be prevented from being decreased when a position of the crystal defect region 23 is separated from the pn junction.

Specifically, in the structure shown in FIG. 2, assuming that an estimated distance from the bottom 14a of the p type column layer 14 to the rear surface of the n⁺ type drain layer 12 is 175 μm, charged particles (ions) were irradiated in such a manner that the charged particles were stopped at positions of 150 μm, 155 μm, 160 μm and 165 μm from the rear surface of the n⁺ type drain layer 12. In each experiment, measurement of BVDSS was made for six semiconductor wafers S1 to S6. Variations of peak breakdown voltage before and after irradiation in each experiment are shown in FIGS. 5 to 8. In each of FIGS. 5 to 8, a horizontal axis represents a pn charge balance of a super junction MISFET structure. A peak breakdown voltage at a balance of substantially p=n is shown near 0 (zero) of the horizontal axis. In each of FIGS. 5 to 8, a vertical axis represents a breakdown voltage BVDSS. In each of FIGS. 5 to 8, numerals in the left side indicate "(distance from the rear surface of the n⁺ type drain layer 12/estimated distance from the pn junction of the bottom 14a of the p type column layer 14) of the ion stop position."

Figure 5:
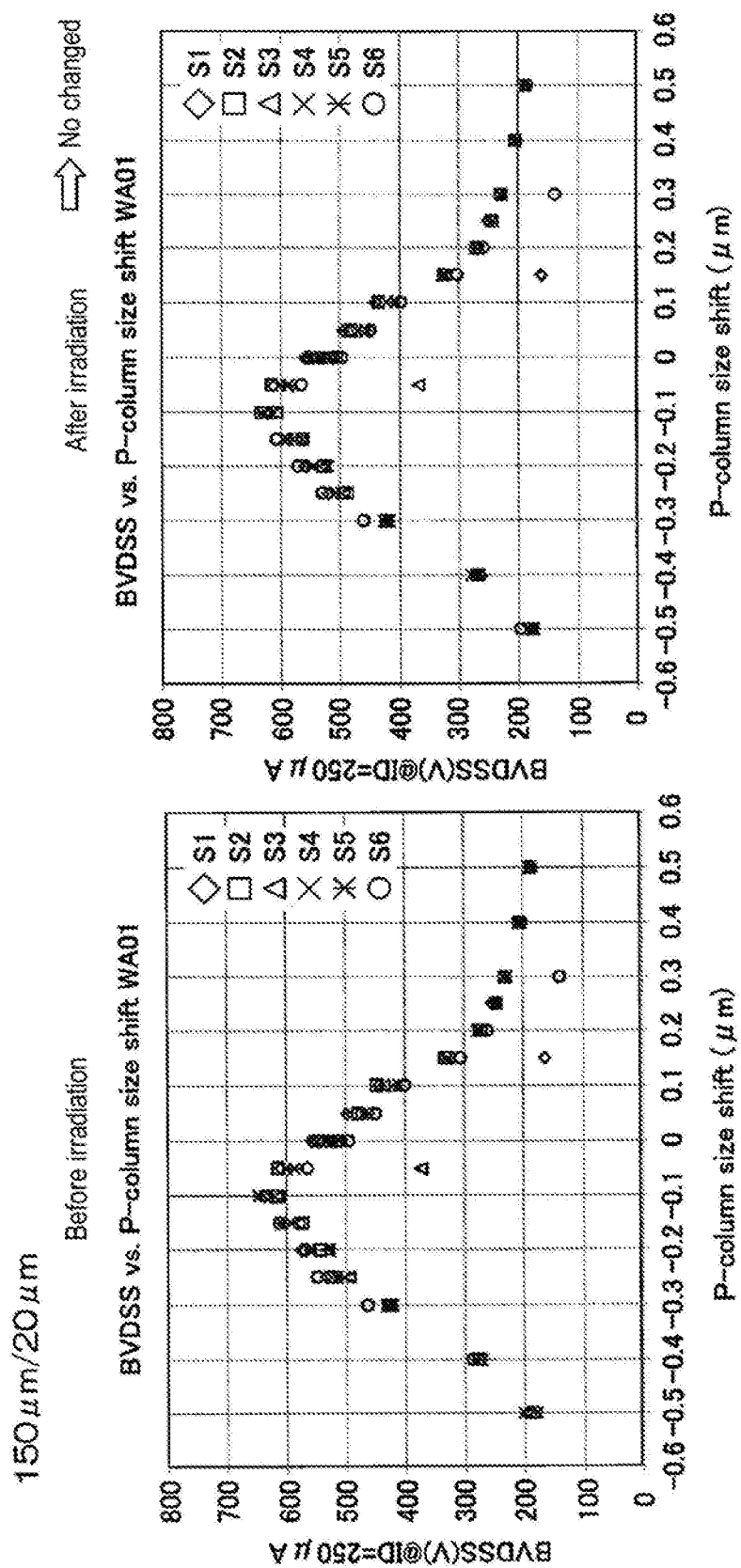
FIG. 5 is a graph showing results of verification on a variation in peak breakdown voltage with respect to an ion stop position.
Figure 6:
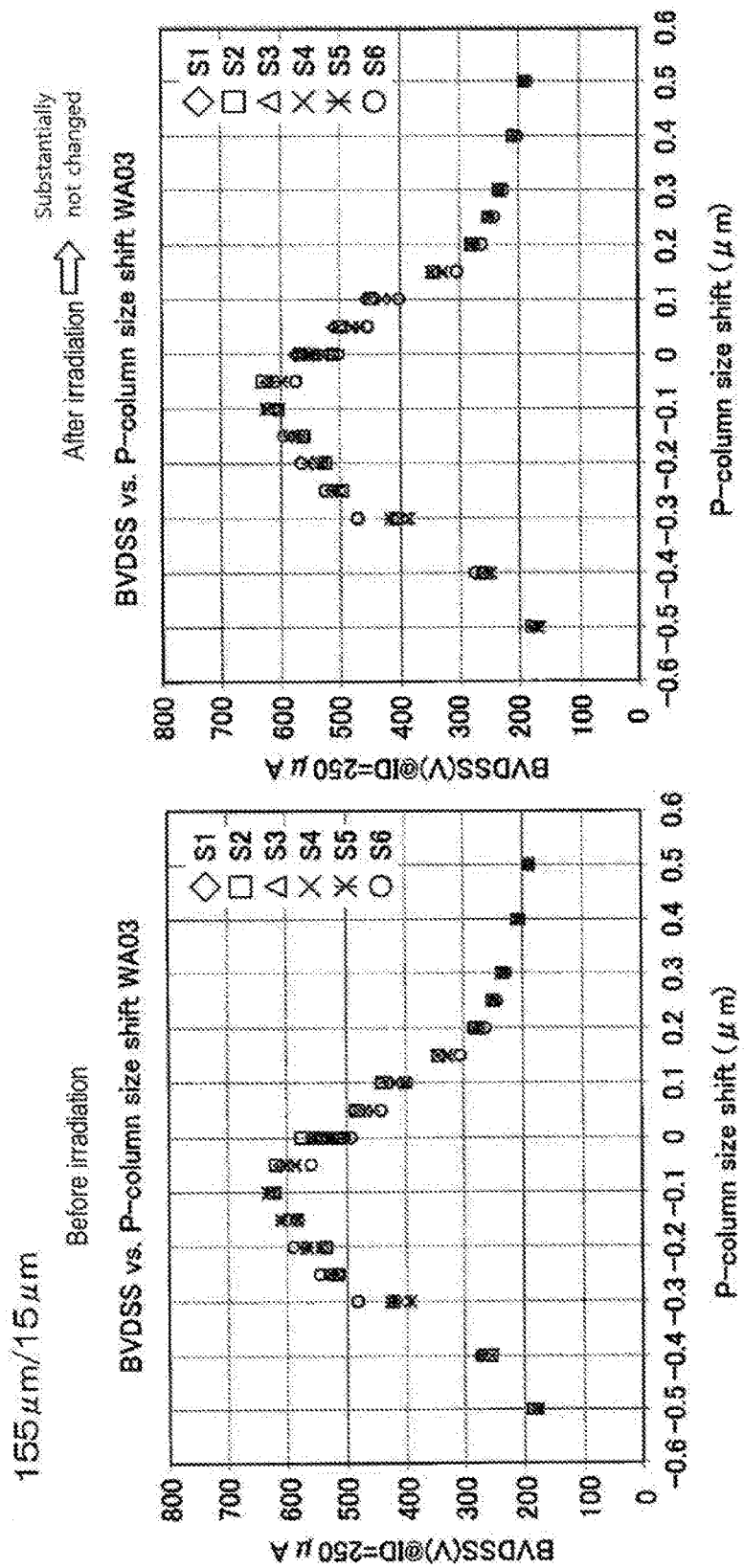
FIG. 6 is a graph showing results of verification on a variation in peak breakdown voltage with respect to an ion stop position.
Figure 7:
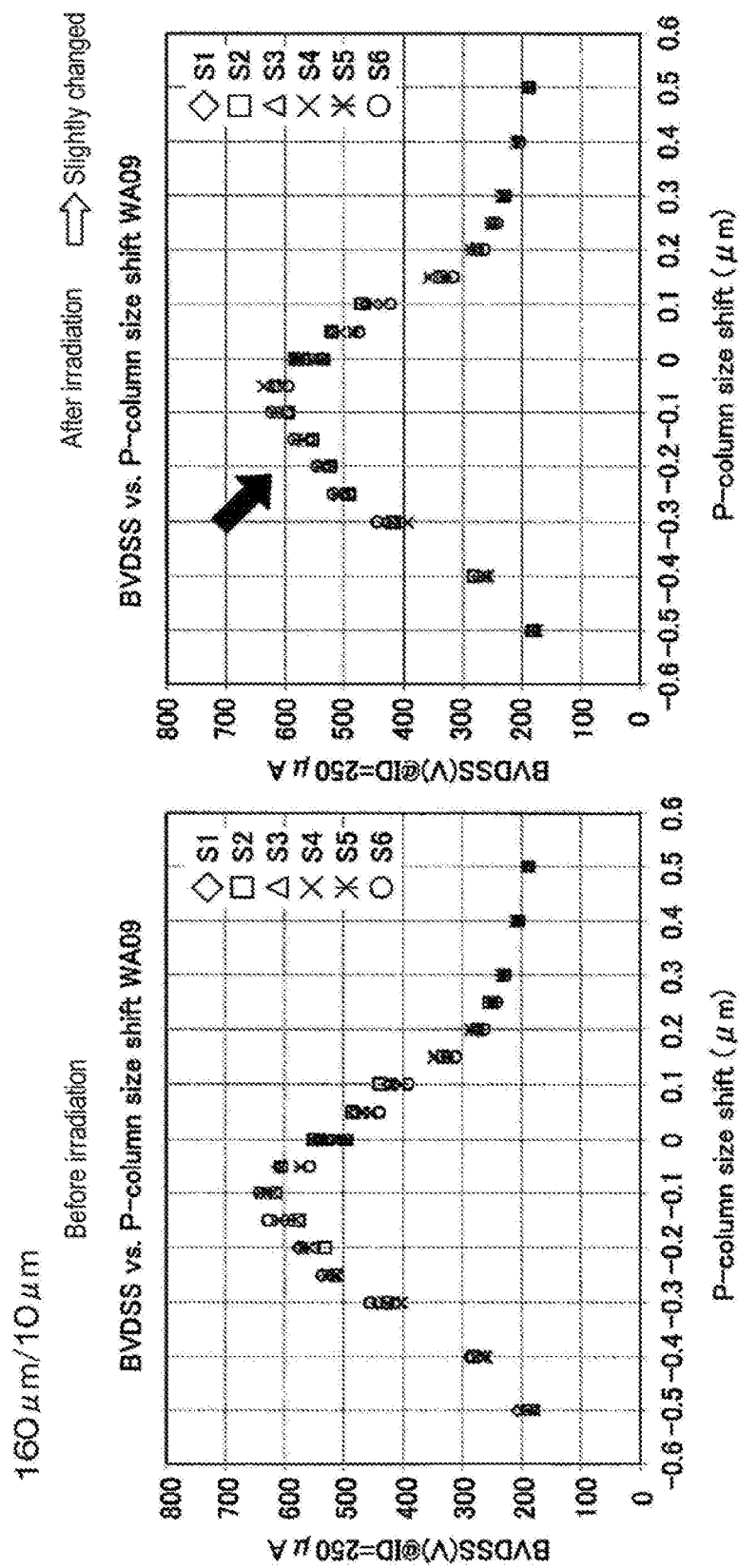
FIG. 7 is a graph showing results of verification on a variation in peak breakdown voltage with respect to an ion stop position.
Figure 8:
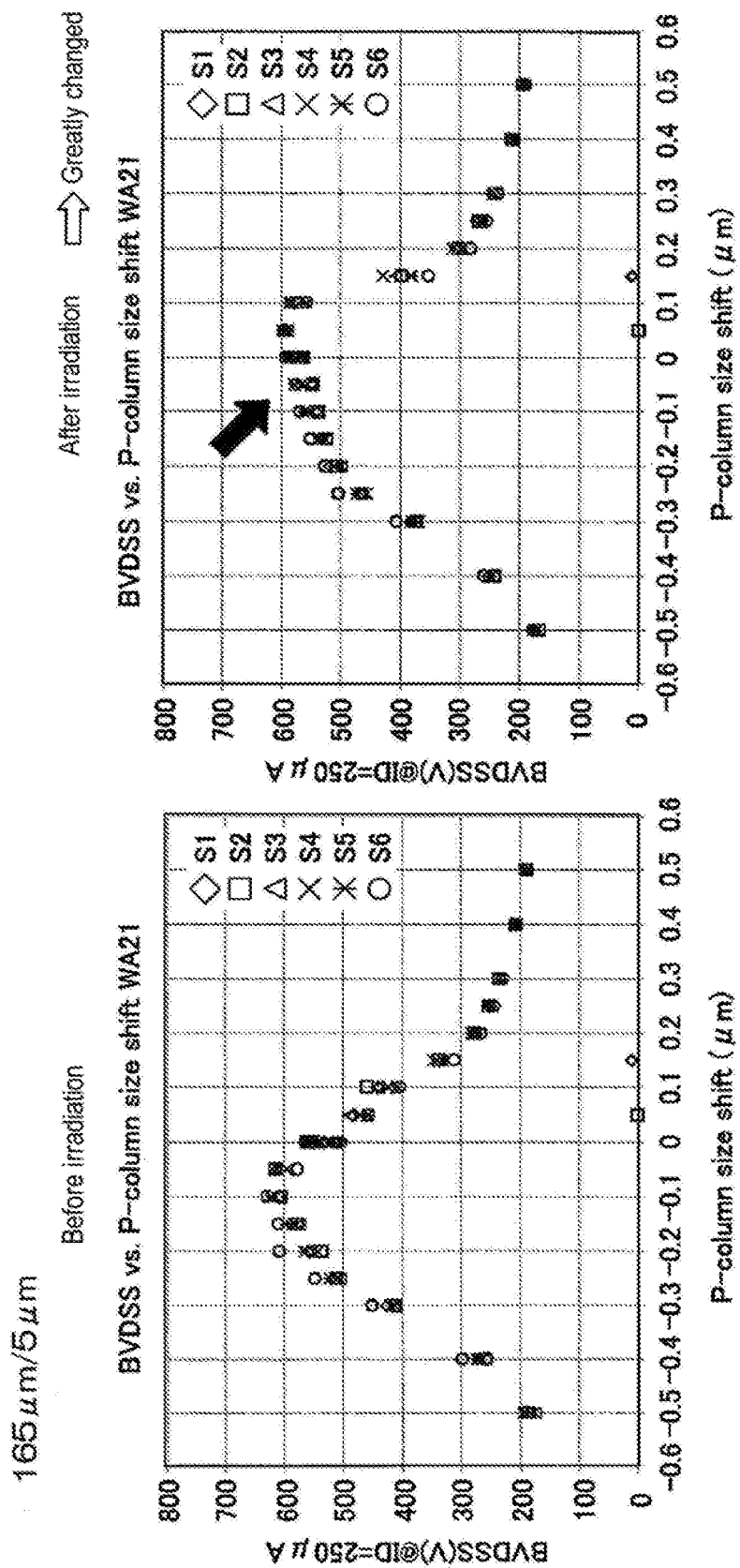
FIG. 8 is a graph showing results of verification on a variation in peak breakdown voltage with respect to an ion stop position.

It can be seen from FIGS. 5 to 8 that the peak breakdown voltage of the semiconductor device 1 is greatly varied when the estimated distance from the pn junction of the bottom 14a of the p type column layer 14 is 5 μm, whereas the variation is decreased with the increase in the estimated distance, showing little or no variation at 15 μm (FIG. 6) and 20 μm (FIG. 5). Therefore, it is found from this result that, when the crystal defect region 23 (the inactive side crystal defect region 29) is formed at a position distant from the p type guard ring 11 having the breakdown voltage structure as described above, it is possible to reduce an effect by the inactive side crystal defect region 29 and maintain the function of the breakdown voltage structure of the semiconductor device 1.

(2) Effect by Masking of Peripheral Field Region

This is to verify that the breakdown voltage of the semiconductor device 1 can be prevented from being decreased when the crystal defect region 23 is formed in the inactive region 4.

Figure 9:
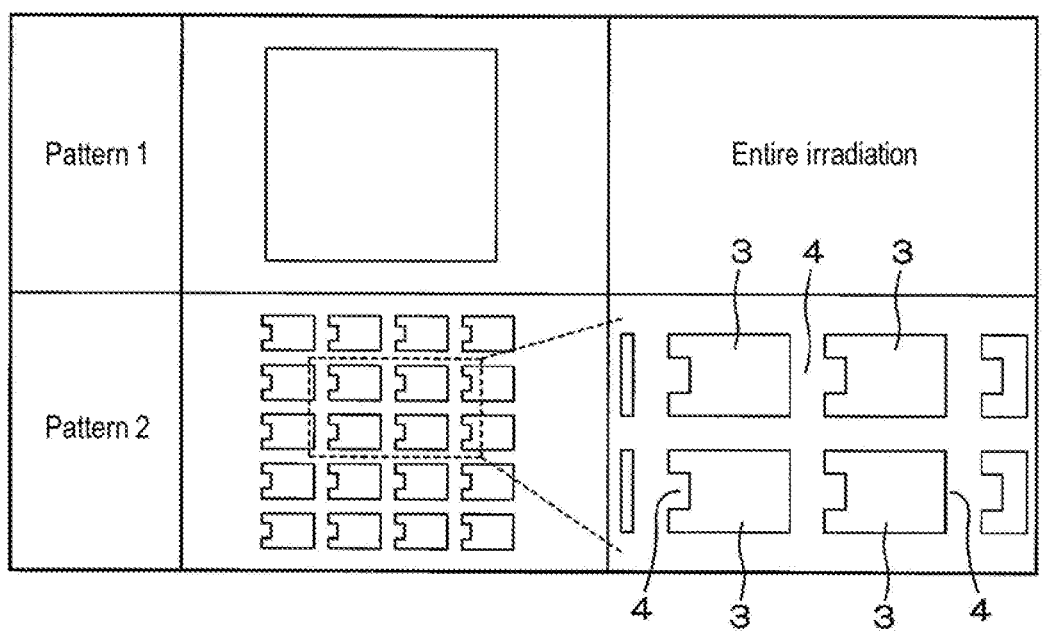
FIG. 9 is a view illustrating an irradiation pattern used for verification on an effect obtained by masking a peripheral field region.
Figure 10:
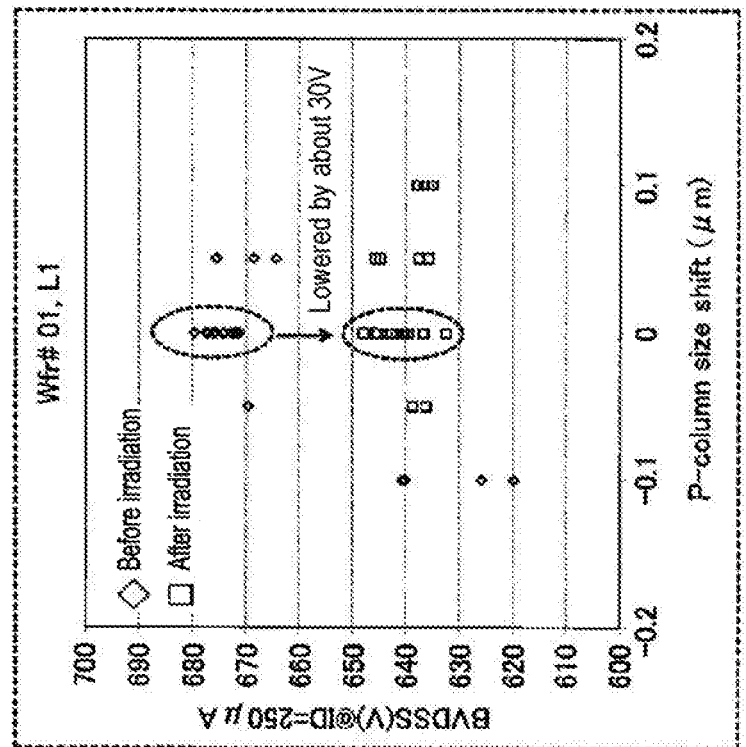
FIG. 10 is a graph showing results of verification on a variation in breakdown voltage before and after irradiation of $^3He^{++}$ ions.
Figure 10:
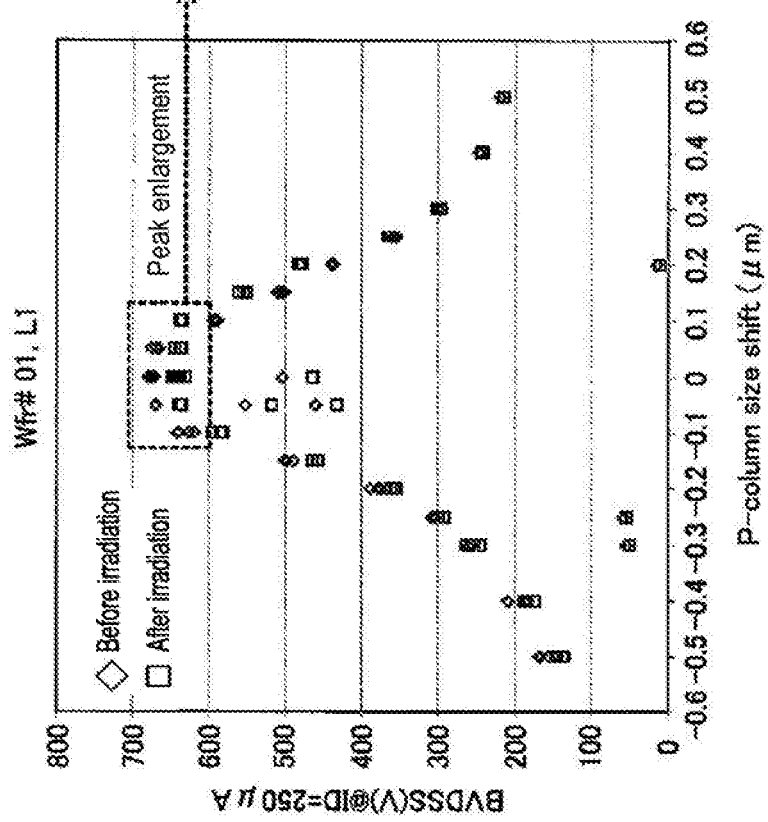
Figure 11:
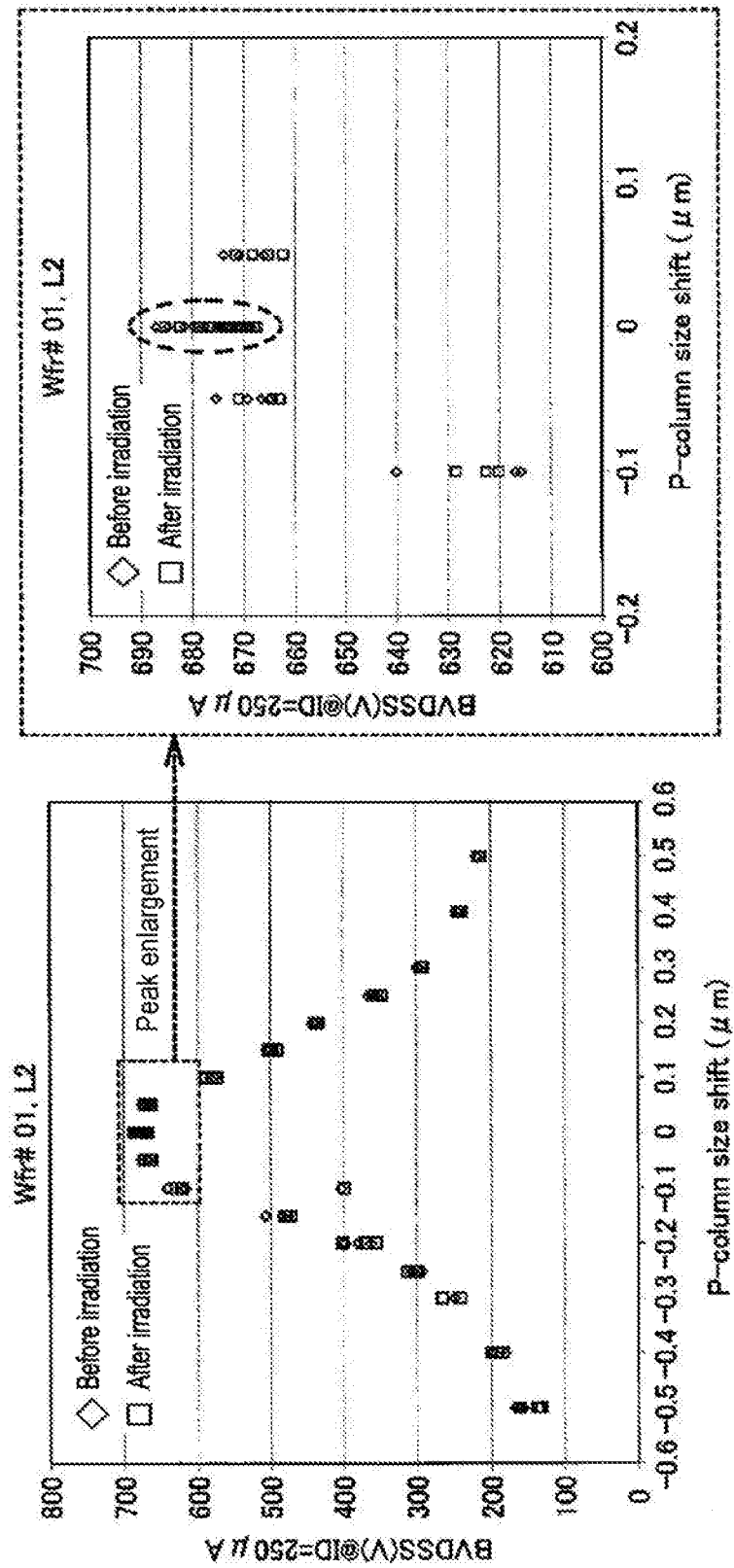
FIG. 11 is a graph showing results of verification on a variation in breakdown voltage before and after irradiation of $^3He^{++}$ ions.
Figure 12:
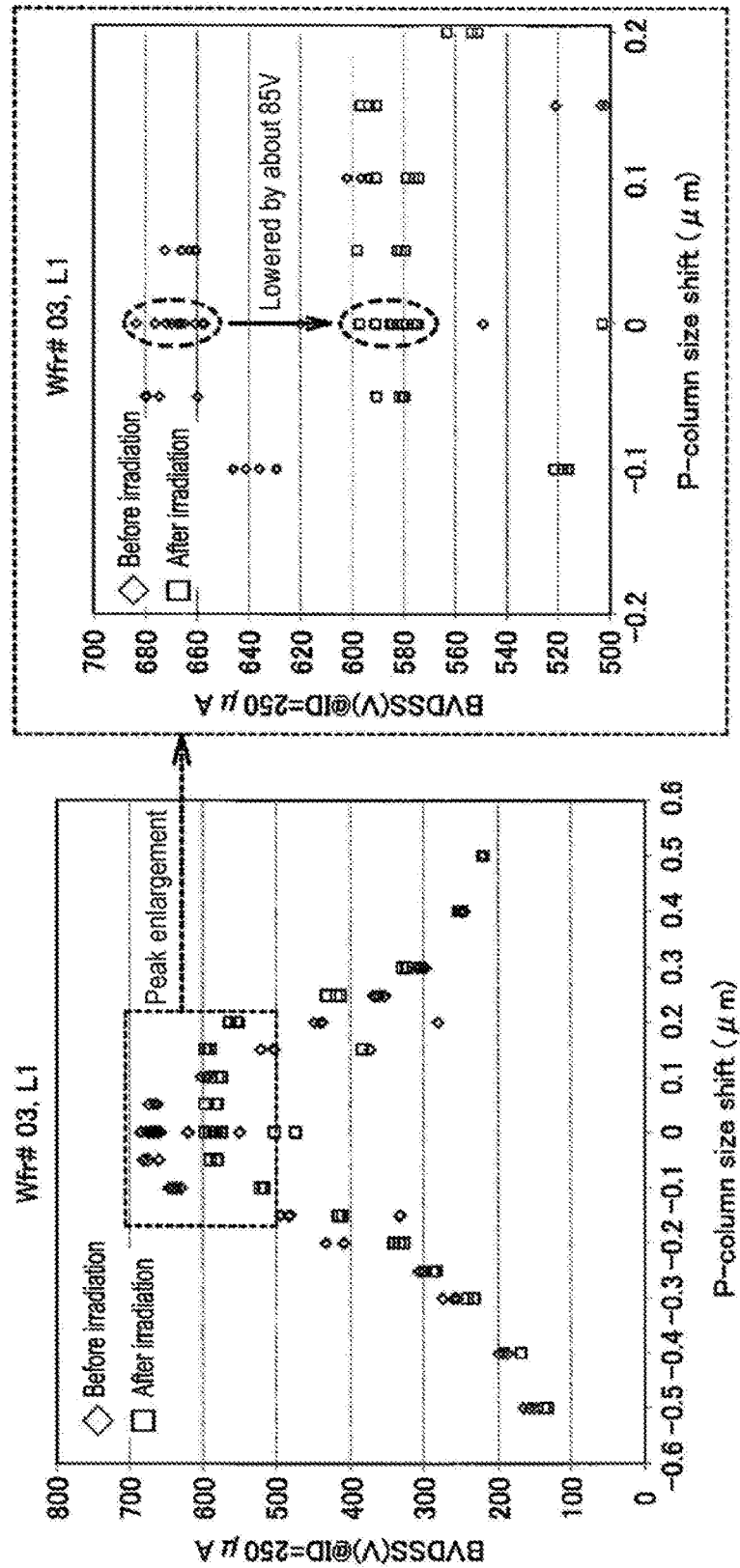
FIG. 12 is a graph showing results of verification on a variation in breakdown voltage before and after irradiation of $^3He^{++}$ ions.
Figure 13:
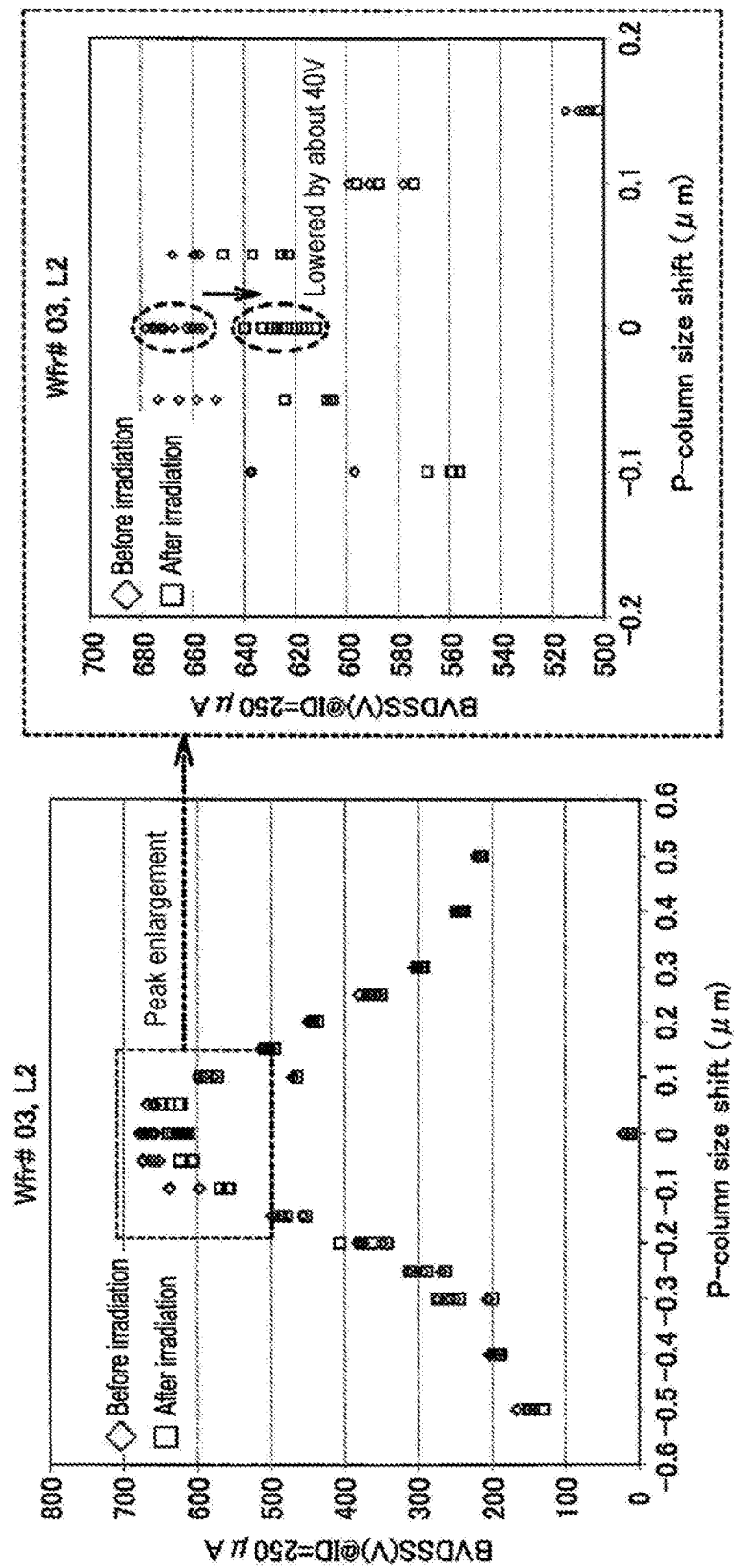
FIG. 13 is a graph showing results of verification on a variation in breakdown voltage before and after irradiation of $^3He^{++}$ ions.

Specifically, a TEG (Test Element Group) of pattern 1 and pattern 2 shown in FIG. 9 was fabricated into a silicon wafer in which a number of MISFET structures of FIG. 2 were built. The pattern 1 is a pattern in which the rear surface of the semiconductor device 1 is not covered by a mask and charged particles are implanted into the entire rear surface. The pattern 2 is a pattern in which the inactive region 4 of the semiconductor device 1 is covered by a mask plate and charged particles are not implanted into the inactive region 4. For each of the patterns 1 and 2, assuming that an estimated distance from the bottom 14a of the p type column layer 14 to the rear surface of the n⁺ type drain layer 12 is 175 μm, charged particles were irradiated in such a manner that the charged particles were stopped at positions of 165 μm and 175 μm from the rear surface of the n⁺ type drain layer 12. The irradiation of charged particles was performed under the conditions of ion species: $^3$He$^{++}$, dose: $1.0 \times 10^{12}$/cm$^2$ and low temperature annealing: 350 degrees C. for 60 minutes. Variations of peak breakdown voltage before and after irradiation in each experiment are shown in FIGS. 10 to 13. In each of FIGS. 10 to 13, a horizontal axis represents a pn charge balance of a super junction MISFET structure. A peak breakdown voltage at a balance of substantially p=n is shown near 0 (zero) of the horizontal axis. In each of FIGS. 10 to 13, a vertical axis represents a breakdown voltage BVDSS.

It can be seen from FIGS. 10 to 13 that, as a result that the crystal defect region 23 is formed in the vicinity of the bottom 14a of the p type column layer 14 of the active region 3, the pattern 2 (particularly FIG. 13) shows a slight variation of the peak breakdown voltage, which is about ½ of that of the pattern 1 (FIG. 12) under the same irradiation conditions. In other words, when the crystal defect region 23 is formed in the vicinity of the bottom 11a of the peripheral p type guard ring 11 as in the pattern 1, the breakdown voltage of the semiconductor device 1 is significantly decreased. Therefore, it is found from this result that, even when the crystal defect region 23 (the active side crystal defect region 28) is formed in the vicinity of the bottom 14a of the p type column layer 14 as described above, there is a low possibility that the breakdown voltage is decreased, but rather, the active side crystal defect region 28 preferentially works to reduce a reverse recovery time by trapping carriers (electrons). In addition, it is found that, when the crystal defect region 23 (the inactive side crystal defect region 29) is formed at a position distant from the p type guard ring 11 having the breakdown voltage structure as described above, it is possible to reduce an effect by the inactive side crystal defect region 29 and maintain the function of the breakdown voltage structure of the semiconductor device 1.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device comprising:
an n type semiconductor layer including an active region and an inactive region;
an element structure which is formed in the active region and includes at least an active side p type layer to form a pn junction with an n type portion of the n type semiconductor layer;
an inactive side p type layer which is formed in the inactive region and forms a pn junction with the n type portion of the n type semiconductor layer;
a first electrode which is electrically connected to the active side p type layer in a front surface of the n type semiconductor layer;
a second electrode which is electrically connected to the n type portion of the n type semiconductor layer in a rear surface of the n type semiconductor layer; and
a crystal defect region which is formed in both of the active region and the inactive region, the crystal defect region in the active region being at a first depth within the n type semiconductor layer and the crystal defect region in the inactive region being at a second depth within the n type semiconductor layer, and the second depth being different from the first depth,
wherein the element structure includes:
an n type base layer;
a p type base layer which is partially formed on a surficial layer portion of the n type base layer in the active region;
an n type source layer which is partially formed on the surficial layer portion of the n type base layer in the active region;

a gate insulating film which is formed on a front surface of the p type base layer between the n type source layer and the n type base layer; and a gate electrode on the gate insulating film, the gate electrode facing the n type source layer and the p type base layer via the gate insulating film, and wherein the active side p type layer includes a p type column layer which is formed in the n type base layer to be continuous to the p type base layer and extends from a front surface of the n type base layer to a rear surface of the n type base layer.

2. The semiconductor device of claim 1, wherein the crystal defect region in the active region is formed in the vicinity of a bottom of the active side p type layer, and wherein the crystal defect region in the inactive region is formed to be separated from a bottom of the inactive side p type layer such that the crystal defect region of the inactive region is closer to the rear surface of the n type semiconductor layer than the bottom of the inactive side p type layer.

3. The semiconductor device of claim 2, wherein a distance between the crystal defect region in the active region and the bottom of the active side p type layer is 5 μm or less, and wherein a distance between the crystal defect region in the inactive region and the bottom of the inactive side p type layer is 5 μm or more.

4. The semiconductor device of claim 1, wherein the active side p type layer and the inactive side p type layer have the same thickness.

5. The semiconductor device of claim 1, wherein the inactive side p type layer includes a p type guard ring surrounding the active region.

6. The semiconductor device of claim 5, wherein a depth of the p type guard ring equals to a depth of the p type column layer.

7. A method for manufacturing a semiconductor device, comprising:

forming an element structure including at least an active side p type layer to form a pn junction with an n type portion of an n type semiconductor layer including an active region and an inactive region, in the active region of the n type semiconductor layer;

forming an inactive side p type layer to form a pn junction with the n type portion of the n type semiconductor layer, in the inactive region;

forming a level difference on the rear surface of the n type semiconductor layer between the active region and the inactive region such that a level of the active region is lower than a level of the inactive region;

irradiating charged particles over the entire rear surface of the n type semiconductor layer after forming the level difference;

forming a first electrode to be electrically connected to the active side p type layer in a front surface of the n type semiconductor layer; and forming a second electrode to be electrically connected to the n type portion of the n type semiconductor layer in the rear surface of the n type semiconductor layer.

8. The method of claim 7, wherein the act of forming the level difference includes:

forming a mask having an opening on the active region, in the rear surface of the n type semiconductor layer; and forming a concave portion in the n type semiconductor layer by deep-etching the active region through the mask.

9. The method of claim 8, further comprising: after irradiating the charged particles, grinding and flattening the rear surface of the n type semiconductor layer.

10. The method of claim 7, wherein the act of forming the level difference includes:

forming a first mask on the entire rear surface of the n type semiconductor layer;

forming a second mask having an opening on the active region, on the first mask; and forming a level difference between the rear surface of the n type semiconductor layer and the remaining portion of the first mask by etching the first mask through the second mask.

11. The method of claim 7, further comprising: activating a crystal defect region with charged particles implanted into the n type semiconductor layer by subjecting the n type semiconductor layer to a heat treatment at a predetermined first temperature.

12. The method of claim 11, wherein the first temperature is 320 degrees C. to 380 degrees C.

13. The method of claim 11, further comprising: after subjecting the n type semiconductor layer to the heat treatment, forming a rear surface contact by implanting n type impurity ions into the rear surface of the n type semiconductor layer and activating an implantation portion of the n type impurity ions by the heat treatment using laser annealing.

14. The method of claim 7, wherein the charged particles include one of proton, $^3$He$^{++}$ and $^4$He$^{++}$.

15. The method of claim 7, wherein the element structure includes:

an n type base layer;

a p type base layer which is partially formed on a surficial layer portion of the n type base layer in the active region;

an n type source layer which is partially formed on the surficial layer portion of the n type base layer in the active region;

a gate insulating film which is formed on a front surface of the p type base layer between the n type source layer and the n type base layer; and a gate electrode on the gate insulating film, the gate electrode facing the n type source layer and the p type base layer via the gate insulating film, and wherein the active side p type layer includes a p type column layer which is formed in the n type base layer to be continuous to the p type base layer and extends from a front surface of the n type base layer to a rear surface of the n type base layer.

16. The method of claim 15, wherein the inactive side p type layer includes a p type guard ring surrounding the active region.

17. The method of claim 16, wherein the p type guard ring has the same depth as the p type column layer.

* * * * *